(12) United States Patent
Shankar et al.

(10) Patent No.: US 8,847,382 B2
(45) Date of Patent: Sep. 30, 2014

(54) THERMOELECTRIC COOLER SYSTEM, METHOD AND DEVICE

(75) Inventors: Ravi Shankar, Singapore (SG); Olivier Le Neel, Singapore (SG)

(73) Assignee: STMicroelectronics Pte. Ltd., Singapore (SG)

( * ) Notice: Subject to any disclaimer, the term of this patent is extended or adjusted under 35 U.S.C. 154(b) by 818 days.

(21) Appl. No.: 12/961,311

(22) Filed: Dec. 6, 2010

(65) Prior Publication Data

US 2012/0139076 A1 Jun. 7, 2012

(51) Int. Cl.
| H01L 23/10 | (2006.01) |
| H01L 21/00 | (2006.01) |
| H01L 21/40 | (2006.01) |
| H01L 27/16 | (2006.01) |
| H01L 23/38 | (2006.01) |
| H01L 27/08 | (2006.01) |

(52) U.S. Cl.
CPC ............. *H01L 23/38* (2013.01); *H01L 27/16* (2013.01); *H01L 27/0814* (2013.01)
USPC ............................. 257/706; 438/122; 438/540

(58) Field of Classification Search
USPC .................................. 438/122, 540; 257/706
See application file for complete search history.

(56) References Cited

U.S. PATENT DOCUMENTS

| 5,156,004 | A | * | 10/1992 | Wu et al. ........................... 62/3.1 |
| 2003/0214031 | A1 | * | 11/2003 | Onoue ............................ 257/734 |
| 2007/0056621 | A1 | * | 3/2007 | Baskaran ....................... 136/201 |
| 2007/0095383 | A1 | * | 5/2007 | Tajima ............................ 136/238 |
| 2008/0264464 | A1 | * | 10/2008 | Lee et al. ........................ 136/201 |
| 2009/0007952 | A1 | * | 1/2009 | Kondoh et al. ................ 136/203 |
| 2010/0101878 | A1 | * | 4/2010 | Yoshida et al. ............. 180/65.31 |
| 2010/0319746 | A1 | * | 12/2010 | Snyder et al. ................. 136/201 |
| 2011/0000517 | A1 | * | 1/2011 | Park et al. ..................... 136/239 |
| 2011/0048486 | A1 | * | 3/2011 | Sensui et al. .................. 136/203 |

* cited by examiner

*Primary Examiner* — James Mitchell
(74) *Attorney, Agent, or Firm* — Seed IP Law Group PLLC

(57) ABSTRACT

A semiconductor thermoelectric cooler includes P-type and N-type thermoelectric cooling elements. The P-type and N-type thermoelectric elements have a first portion having a first cross-sectional area and a second portion having a second cross-sectional area larger than the first cross-sectional area. The P-type and N-type thermoelectric cooling elements may, for example, be T-shaped or L-shaped. In another example, the thermoelectric cooling elements have a first surface having a first shape configured to couple to a first electrical conductor and a second surface opposite the first surface and having a second shape, different from the first shape, and configured to couple to a second electrical conductor. For example, the first surface may have a rectilinear shape of a first area and the second surface may have a rectilinear shape of a second area different from the first area. The semiconductor thermoelectric cooler may be manufactured using thin film technology.

42 Claims, 17 Drawing Sheets

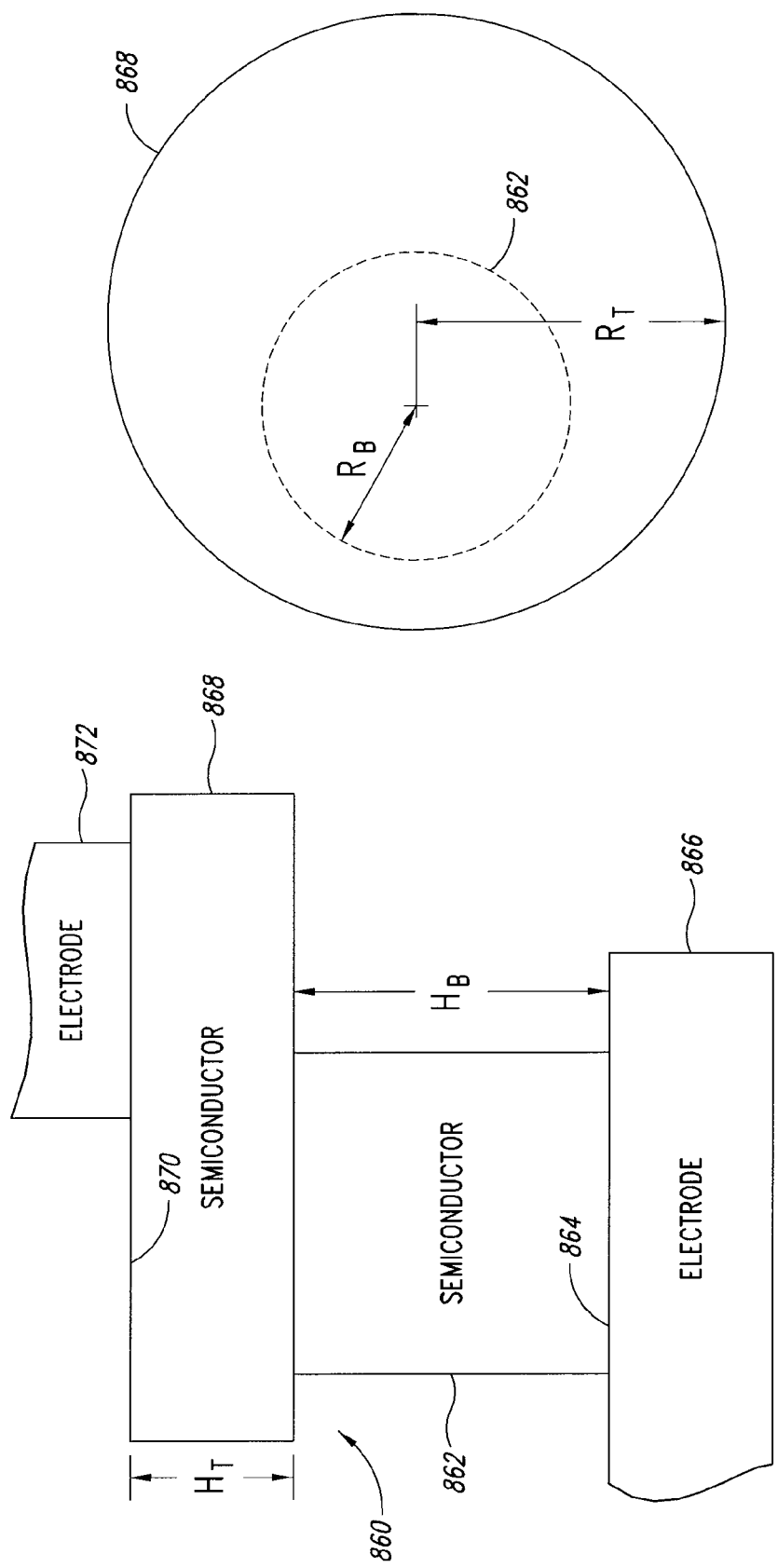

THERMOELECTRIC COOLER SYSTEM, METHOD AND DEVICE

BACKGROUND

1. Technical Field

This disclosure relates to thermoelectric cooling devices and to semiconductor packages and systems with thermoelectric cooling devices.

2. Description of the Related Art

Integrated circuits, and semiconductor packages containing integrated circuits, often generate heat which may damage or impair the functioning of the semiconductor packages and/or other components of a device including integrated circuits. Conventional solutions to address the generation of heat include passive elements, such as heat sinks and heat pipes, and active elements, such as fans, microrefrigerators and thermoelectric cooling (TEC) devices to transfer heat energy, hot or cold, to or away from a part of the integrated circuit. For example, a TEC may comprise one or more P and/or N type diodes which in response to a current flow heat one side of the TEC and cool the other side of the TEC. Conventional TEC devices generally use bulk metal molding and ceramic thermal conductors, and may typically have an area of 16 cm$^2$.

BRIEF SUMMARY

In an embodiment, an integrated circuit comprises: a first thermally conductive region; a first electrode having a first surface on the first thermally conductive region and a second surface opposite of the first surface; a first semiconductor region of a first type having a first surface at least partially on the second surface of the first electrode; a second semiconductor region of a second type different from the first type and having a first surface at least partially on the second surface of the first electrode; a second electrode having a first surface on a second surface of the first semiconductor region, the second surface of the first semiconductor region being opposite of the first surface of the first semiconductor region and having a length different than a length of the first surface of the first semiconductor region; a third electrode having a first surface on a second surface of the second semiconductor region, the second surface of the second semiconductor region being opposite of the first surface of the second semiconductor region and having a length different than a length of the first surface of the second semiconductor region; and a second thermally conductive region thermally coupled to the second and third electrodes. In an embodiment, the first semiconductor region comprises: a first portion having the first surface of the first semiconductor region at least partially on the second surface of the first electrode; and a second portion at least partially on the first portion of the first semiconductor region and having the second surface of the first semiconductor region. In an embodiment, the first portion has a thickness greater than a thickness of the second portion. In an embodiment, a cross-section of the first semiconductor region is generally T-shaped. In an embodiment, the second semiconductor region comprises: a first portion having the first surface of the second semiconductor region at least partially on the second surface of the first electrode; and a second portion at least partially on the first portion of the second semiconductor region and having the second surface of the second semiconductor region. In an embodiment, the length of the first surface of the first semiconductor region is a diameter. In an embodiment, a cross-section of the second semiconductor region is generally T-shaped. In an embodiment, an area of the first surface of the first semiconductor region is less than an area of the second surface of the first semiconductor region and an area of the first surface of the second semiconductor region is less than an area of the second surface of the second semiconductor region. In an embodiment, the second thermally conductive region comprises: a connecting portion; a first thermal channel extending from the connecting portion to a second surface of the second electrode, the second surface of the second electrode being opposite of the first surface of the second electrode; and a second thermal channel extending from the connecting portion to a second surface of the third electrode, the second surface of the third electrode being opposite of the first surface of the third electrode. In an embodiment, the integrated circuit further comprises: a dielectric region positioned between the first thermal channel and the second thermal channel and having a thermal conductivity less than a thermal conductivity of the first and second thermal channels. In an embodiment, the integrated circuit further comprises a dielectric region positioned between the first and second semiconductor regions. In an embodiment, the dielectric region comprises at least one of a polymer and an oxide. In an embodiment, the first semiconductor region is a P-type semiconductor region and the second semiconductor region is an N-type semiconductor region. In an embodiment, the first and second thermally conductive regions comprise at least one of silicon nitride and silicon carbide. In an embodiment, the integrated circuit further comprises: an active device on the second thermally conductive region. In an embodiment, the integrated circuit further comprises: a heat sink coupled to the first thermally conductive region.

In an embodiment, a system comprises: a first thermally conductive layer; a first plurality of unit cells on the first thermally conductive layer, the unit cells having: a unit cell electrode on the first thermally conductive layer; a P-type semiconductor region having a first portion with a first surface at least partially on the unit cell electrode and a second portion on the first portion of the P-type semiconductor region, a coupling surface of the second portion having a dimension different than a corresponding dimension of the first surface of the first portion of the P-type semiconductor region; and an N-type semiconductor region having a first portion with a first surface at least partially on the unit cell electrode and a second portion on the first portion of the N-type semiconductor region, a coupling surface of the second portion having a dimension different than a corresponding dimension of the first surface of the first portion of the N-type semiconductor region; a first plurality of coupling electrodes configured to electrically couple coupling surfaces of second portions of N-type semiconductor regions of unit cells to coupling surfaces of second portions of P-type semiconductor regions of adjacent unit cells; and a second thermally conductive layer thermally coupled to the first plurality of coupling electrodes. In an embodiment, the first portion of the P-type semiconductor region of a unit cell of the plurality of unit cells has a cross-sectional area different than a cross-sectional area of the second portion of the P-type semiconductor region and the first portion of the N-type semiconductor region of the unit cell has a cross-sectional area different than a cross-sectional area of the second portion of the N-type semiconductor region. In an embodiment, the first portion of the P-type semiconductor region of a unit cell of the plurality of unit cells has a length and a thickness and the second portion of the P-type semiconductor region has a length greater than the length of the first portion of the P-type semiconductor region and a thickness less than the thickness of the first portion of the P-type semiconductor region. In an embodiment, the first portion of the N-type semiconductor region of the unit cell has a length and a thickness and the second portion of the N-type semiconductor region has a length greater than the length of the first portion of the N-type semiconductor region and a thickness less than the thickness of the first portion of the N-type semiconductor region. In an embodiment, a cross-section of the P-type semiconductor region of a unit cell of the plurality of unit cells is generally T-shaped. In an embodiment, a cross-section of the N-type semiconductor region of the unit cell is generally T-shaped. In an embodiment, the second thermally conductive layer is thermally coupled to the first plurality of coupling electrodes through a first plurality of thermally conductive channels extending from the second thermally conductive layer, and the system further comprises: one or more regions of dielectric material positioned between the first plurality of thermally conductive channels extending from the second thermally conductive layer, the one or more of regions of dielectric material having a lower thermal conductivity than a thermal conductivity of the first plurality of thermally conductive channels extending from the second thermally conductive layer. In an embodiment, a coupling electrode of the first plurality of coupling electrodes is coupled to a thermally conductive channel of the first plurality of thermally conductive channels on a first portion of a face of the coupling electrode and a part of a region of the one or more regions of dielectric material is on a second portion of the face of the coupling electrode adjacent to the first portion of the face of the coupling electrode. In an embodiment, the system further comprises: a second plurality of unit cells on the first thermally conductive layer, the unit cells in the second plurality of unit cells having a unit cell electrode on the first thermally conductive layer, a P-type semiconductor region on the unit cell electrode and an N-type semiconductor region on the unit cell electrode; and a second plurality of coupling electrodes configured to electrically couple the second plurality of unit cells together in series. In an embodiment, the first plurality of unit cells and the second plurality of unit cells are coupled together in series. In an embodiment, the first plurality of unit cells and the second plurality of unit cells are coupled together in parallel. In an embodiment, the first and second thermally conductive layers comprise at least one of silicon nitride and silicon carbide. In an embodiment, the system further comprises: one or more dielectric regions positioned between the unit cell electrodes of the first plurality of unit cells; and one or more dielectric regions positioned between the P-type and the N-type semiconductor regions of the first plurality of unit cells. In an embodiment, the system further comprises: an active device on the second thermally conductive layer.

In an embodiment, a method comprises: forming a first thermally conductive region; forming a first plurality of unit cells on the first thermally conductive region, the forming the first plurality of unit cells including: forming a first plurality of unit cell electrodes on the first thermally conductive region; forming respective first P-type semiconductor regions on the first plurality of unit cell electrodes; forming respective first N-type semiconductor regions on the first plurality of unit cell electrodes; forming respective second P-type semiconductor regions on the first P-type semiconductor regions; and forming respective second N-type semiconductor regions on the first N-type semiconductor regions; forming a first plurality of coupling electrodes electrically coupling the first plurality of unit cells together in series; and forming a second thermally conductive region thermally coupled to the first plurality of coupling electrodes. In an embodiment, the first P-type semiconductor region of a unit cell of the plurality of unit cells has a length different than a length of the second P-type semiconductor region of the unit cell and the first N-type semiconductor region of the unit cell has a length different than a length of the second N-type semiconductor region of the unit cell. In an embodiment, the first P-type semiconductor region of a unit cell of the plurality of unit cells has a length and a thickness and the second P-type semiconductor region of the unit cell has a length greater than the length of the first P-type semiconductor region and a thickness less than the thickness of the first P-type semiconductor region, and the first N-type semiconductor region of the unit cell has a length and a thickness and the second N-type semiconductor region of the unit cell has a length greater than the length of the first N-type semiconductor region and a thickness less than the thickness of the first N-type semiconductor region. In an embodiment, forming the second thermally conductive region thermally coupled to the first plurality of coupling electrodes comprises: forming a dielectric region on the first plurality of coupling electrodes; forming thermally conductive channels extending through the dielectric region to the coupling electrodes, the dielectric region having a lower thermal conductivity than the thermally conductive channels; and forming the second thermally conductive region on the dielectric region and the thermally conductive channels extending through the dielectric region. In an embodiment, forming the first and second thermally conductive regions comprises forming at least one of a silicon nitride region and a silicon carbide region and forming the dielectric region comprises forming at least one of a polymer region and an oxide region. In an embodiment, the method further comprises: forming an active device on the second thermally conductive region. In an embodiment, the method comprises: forming a second plurality of unit cells on the first thermally conductive region; and forming a second plurality of coupling electrodes configured to electrically couple the second plurality of unit cells together in series.

In an embodiment, a semiconductor package comprises: an active device; and a thermoelectric cooling device coupled to the active device and including: first means for spreading heat; second means for spreading heat coupled to the active device; and means for thermoelectrically transferring heat from the second means for spreading heat to the first means for spreading heat, the means for transferring heat having: a plurality of P-type regions having a first portion with a first dimension of a first magnitude and a second portion having a corresponding dimension of a second magnitude different from the first magnitude; and a plurality of N-type regions having a first portion with a first dimension of a third magnitude and a second portion having a corresponding dimension of a fourth magnitude different from the third magnitude. In an embodiment, the first and second means for spreading heat comprise at least one of a layer of silicon nitride and a layer of silicon carbide. In an embodiment, a cross-section of a P-type semiconductor region of the plurality of P-type semiconductor regions is generally T-shaped and a cross-section of an N-type semiconductor region of the plurality of N-type semiconductor regions is generally T-shaped. In an embodiment, the first portion of a P-type region of the plurality of P-type regions has a different doping level than a doping level of the second portion of the P-type region.

In an embodiment, an integrated circuit comprises: a first dielectric region of a first thermal conductivity; a first electrode having a first surface on the first dielectric region and a second surface opposite of the first surface; a first semiconductor region of a first type having a first surface at least partially on the second surface of the first electrode; a second semiconductor region of a second type different from the first type and having a first surface at least partially on the second surface of the first electrode; a second electrode having a first surface on a second surface of the first semiconductor region, the second surface of the first semiconductor region being opposite of the first surface of the first semiconductor region; a third electrode having a first surface on a second surface of the second semiconductor region, the second surface of the second semiconductor region being opposite of the first surface of the second semiconductor region; a second dielectric region of a second thermal conductivity having: a connecting portion; a first thermal channel extending from the connecting portion to a second surface of the second electrode, the second surface of the second electrode being opposite of the first surface of the second electrode; and a second thermal channel extending from the connecting portion to a second surface of the third electrode, the second surface of the third electrode being opposite of the first surface of the third electrode; and a third dielectric region of a third thermal conductivity positioned between the first thermal channel of the second dielectric region and the second thermal channel of the second dielectric region, the third thermal conductivity being less than the second thermal conductivity. In an embodiment, the first semiconductor region is a P-type semiconductor region and the second type of semiconductor region is an N-type semiconductor region. In an embodiment, part of the third dielectric region is on the second surface of the second electrode and part of the third dielectric region is on the second surface of the third electrode. In an embodiment, the third dielectric region extends between the second surface of the first electrode and the connecting portion of the second dielectric region. In an embodiment, the third dielectric region extends between the second surface of the first electrode and the connecting portion of the second dielectric region. In an embodiment, the first thermal conductivity is equal to the second thermal conductivity. In an embodiment, the first and second dielectric regions comprise at least one of silicon nitride and silicon carbide. In an embodiment, the third dielectric region comprises at least one of a polymer and an oxide. In an embodiment, the third dielectric region comprises at least one of polyimide, parylene, silicon dioxide and benzocyclobutane. In an embodiment, the integrated circuit further comprises: an active device on the second dielectric region. In an embodiment, the integrated circuit further comprises: a heat sink coupled to the first dielectric region. In an embodiment, the integrated circuit further comprises: a fourth dielectric region of the third thermal conductivity positioned between the first dielectric region and a third surface of the second electrode.

In an embodiment, a system comprises: a first thermally conductive layer; a first plurality of unit cells on the first thermally conductive layer, the unit cells having a unit cell electrode on the first thermally conductive layer, a P-type semiconductor region on the unit cell electrode and an N-type semiconductor region on the unit cell electrode; a first plurality of coupling electrodes configured to electrically couple the first plurality of unit cells together in series; a second thermally conductive layer thermally coupled to the plurality of coupling electrodes through a first plurality of thermally conductive channels extending from the second thermally conductive layer; and one or more regions of dielectric material positioned between the first plurality of thermally conductive channels extending from the second thermally conductive layer, the one or more of regions of dielectric material having a lower thermal conductivity than a thermal conductivity of the first plurality of thermally conductive channels extending from the second thermally conductive layer. In an embodiment, the system further comprises: a second plurality of unit cells on the first thermally conductive layer, the unit cells in the second plurality of unit cells having a unit cell electrode on the first thermally conductive layer, a P-type semiconductor region on the unit cell electrode and an N-type semiconductor region on the unit cell electrode; a second plurality of coupling electrodes configured to electrically couple the second plurality of unit cells together in series; and a second plurality of thermally conductive channels extending from the second thermally conductive layer and coupling the second thermally conductive layer to the second plurality of unit cells. In an embodiment, the one or more regions of dielectric material extend between adjacent thermally conductive channels of the first and second pluralities of thermally conductive channels. In an embodiment, the system further comprises one or more additional regions of dielectric material positioned between the second plurality of thermally conductive channels. In an embodiment, the first plurality of unit cells and the second plurality of unit cells are coupled together in series. In an embodiment, the first plurality of unit cells and the second plurality of unit cells are coupled together in parallel. In an embodiment, a coupling electrode of the first plurality of coupling electrodes is coupled to a thermally conductive channel of the first plurality of thermally conductive channels on a first portion of a face of the coupling electrode and a part of a region of the one or more regions of dielectric material is on a second portion of the face of the coupling electrode adjacent to the first portion of the face of the coupling electrode. In an embodiment, the first and second thermally conductive layers comprise at least one of silicon nitride and silicon carbide, the first plurality of thermally conductive channels comprise at least one of silicon nitride and silicon carbide, and the one or more regions of dielectric material comprise at least one of a polymer and an oxide. In an embodiment, the system further comprises: one or more additional dielectric regions positioned between the unit cell electrodes. In an embodiment, the system further comprises: an active device on the second thermally conductive layer. In an embodiment, the P-type semiconductor region of a unit cell has a first surface having a first dimension of a first magnitude and at least partially in contact with the unit cell electrode and a second surface having a first dimension of a second magnitude different from the first magnitude and at least partially in contact with a coupling electrode of the first plurality of coupling electrodes. In an embodiment, the N-type semiconductor region of a unit cell has a first surface having a first length and at least partially in contact with the unit cell electrode and a second surface having a second length different from the first length and at least partially in contact with a coupling electrode of the first plurality of coupling electrodes.

In an embodiment, a method comprises: forming a first thermally conductive region; forming a first plurality of unit cells on the first thermally conductive region, the forming the first plurality of unit cells including: forming a first plurality of unit cell electrodes on the first thermally conductive region; forming respective P-type semiconductor regions on the first plurality of unit cell electrodes; and forming respective N-type semiconductor regions on the first plurality of unit cell electrodes; forming a first plurality of coupling electrodes electrically coupling the first plurality of unit cells together in series; forming a dielectric region on the first plurality of coupling electrodes; forming thermally conductive channels extending through the dielectric region to the coupling electrodes, the dielectric region having a lower thermal conductivity than the thermally conductive channels; and forming a second thermally conductive region on the dielectric region and the thermally conductive channels extending through the dielectric region. In an embodiment, forming the first and second thermally conductive regions and the thermally conductive channels comprises forming at least one of a silicon nitride and a silicon carbide region. In an embodiment, forming the dielectric region comprises forming at least one of a polyimide, a silicon dioxide, a parylene and a benzocyclobutane region. In an embodiment, the method further comprises: forming an active device on the second thermally conductive region. In an embodiment, the method comprises: forming a second plurality of unit cells on the first thermally conductive region; and forming a second plurality of coupling electrodes configured to electrically couple the second plurality of unit cells together in series. In an embodiment, forming thermally conductive channels extending through the dielectric region to the coupling electrodes comprises forming a thermally conductive channel in contact with a first portion of a face of a coupling electrode with a second portion of the face of the coupling electrode adjacent to the first portion of the face of the coupling electrode in contact with the dielectric region. In an embodiment, the method further comprises forming a second dielectric region separating the first plurality of unit cells. In an embodiment, a P-type semiconductor region of a unit cell has a first surface of a first length at least partially in contact with the unit cell electrode of the unit cell and a second surface of a second length different from the first length at least partially in contact with a coupling electrode of the first plurality of coupling electrodes. In an embodiment, an N-type semiconductor region of the unit cell has a first surface of a first length at least partially in contact with the unit cell electrode and a second surface of a second length different from the first length at least partially in contact with another coupling electrode of the first plurality of coupling electrodes.

In an embodiment, a semiconductor package comprises: an active device; and a thermoelectric cooling device coupled to the active device and including: first means for spreading heat; second means for spreading heat coupled to the active device; and means for thermoelectrically transferring heat from the second means for spreading heat to the first means for spreading heat, the means for transferring heat having a plurality of means for channeling heat coupled to the second means for spreading heat and means for separating the plurality of means for channeling heat. In an embodiment, the means for separating the plurality of means for channeling heat comprises a dielectric layer and the plurality of means for channeling heat comprise a plurality of legs extending from the second means for spreading heat through the dielectric layer, the dielectric layer having a lower thermal conductivity than a thermal conductivity of the plurality of legs. In an embodiment, the first and second means for spreading heat comprise at least one of a layer of silicon nitride and a layer of silicon carbide. In an embodiment, the means for thermoelectrically transferring heat comprises a coupling electrode having a surface in contact with at least one of the plurality of means for channeling heat and in contact with the dielectric layer.

BRIEF DESCRIPTION OF THE SEVERAL VIEWS OF THE DRAWINGS

FIGS. 8A and 8B show, respectively, a side and top view of an embodiment of a generally T-shaped semiconductor region.

DETAILED DESCRIPTION

Figure 1:
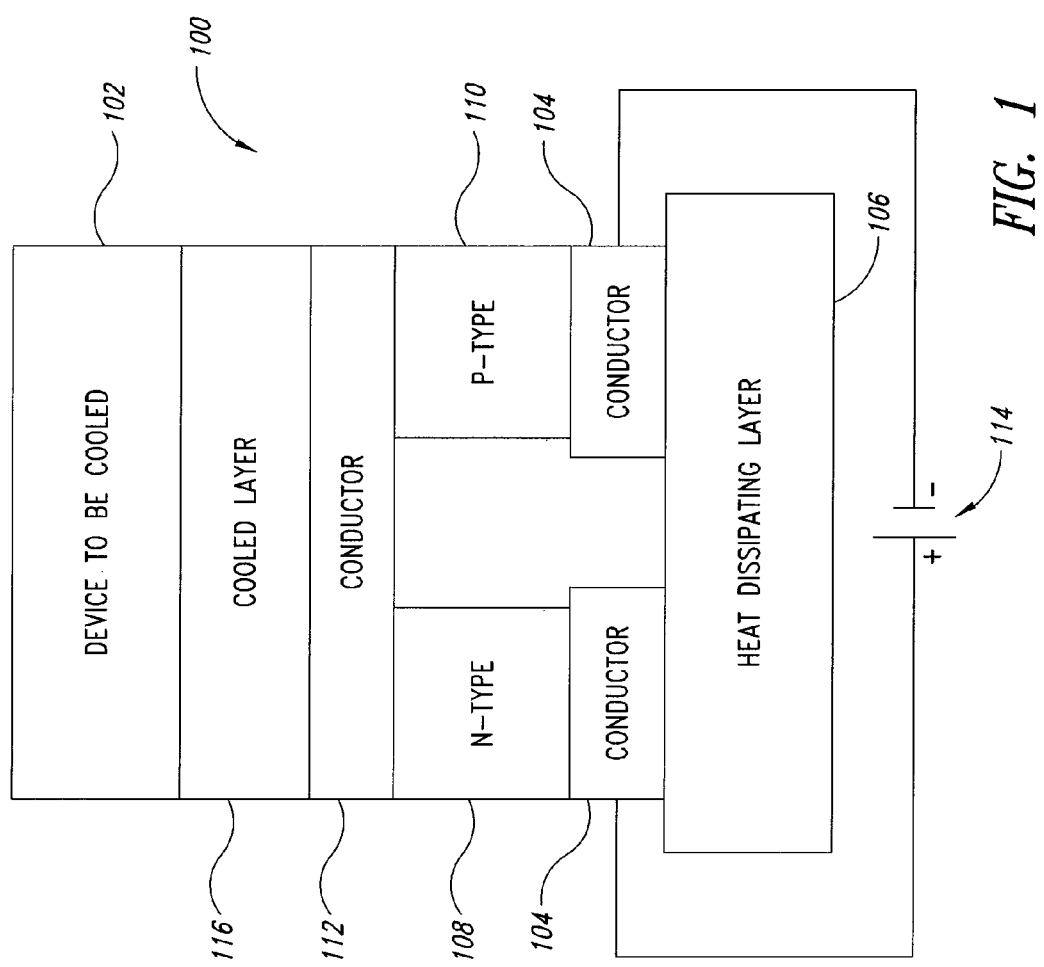
FIG. 1 is a functional block diagram of a thermoelectric cooling system.

In the following description, certain details are set forth in order to provide a thorough understanding of various embodiments of devices, methods and articles. However, one of skill in the art will understand that other embodiments may be practiced without these details. In other instances, well-known structures and methods associated with, for example, integrated circuits, diodes, thin-film deposition techniques, doping, etching, positioning and forming techniques, and devices, using sacrificial layers, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings.

Geometric references and illustrations are not intended to indicate geometrically perfect features. For example, a feature described or illustrated as rectilinear may be generally rectilinear in shape rather than perfectly rectilinear, or may appear rectilinear from a particular perspective, but have an overall shape that is, for example, cylindrical, etc.

The operation of a TEC is based on the Peltier effect. When a current is passed through a PN junction (for example, made with Bismuth telluride material), one side of the junction heats up and the other side cools down. The cold side is used to cool another device or area of interest.

FIG. 1 is a functional block diagram of a thermoelectric cooling system 100 configured to cool a device 102, such as an active or passive device. One or more lower electrical conductors or electrodes 104 are positioned on a heat dissipating layer 106. A plurality of regions or layers of semiconductor material 108, 110 are positioned on the lower electrical conductors 104. As illustrated, an N-type semiconductor layer 108 is positioned on a first lower conductor 104 and a P-type semiconductor layer or region 110 is positioned on a second lower conductor 104. One or more upper electrical conductors or electrodes 112 electrically couple the other sides of semiconductor regions, such as one or more pairs of N-type regions 108 and P-type regions 110 together. As illustrated, conductor 112 electrically couples the top of an N-type semiconductor region 108 to the top of a P-type semiconductive region 110. In operation, a power supply 114 is coupled to the conductors, as illustrated to the conductors 104. A current flows through the semiconductor regions 108, 110. As current flows through the semiconductors, heat is transferred from the upper conductor 112 to the lower conductors 104. In other words, the upper conductor 112 is cooled and the lower conductors 104 are heated. The heat dissipating layer 106 dissipates the heat from the lower conductors 104, and a layer 116 is cooled, cooling the active or passive device 102. Although as illustrated two semiconductor regions or layers are shown forming a single PN junction diode, arrays or multiple cells or pairs of semiconductors coupled together by electrical conductors may be employed. For example, arrays of semiconductor regions coupled together in pairs to form various arrays of diodes may be employed and coupled together so as to cool one region or side of the array in response to the application of a power supply.

In some embodiments, a device to be cooled may be coupled directly to the upper conductor, instead of being coupled to a cooled layer 116. Of course, upper and lower are relative terms, and the system 100 may be inverted when it is desired to cool an active or passive device 102 below the system 100, or otherwise oriented to cool a desired device or region or area, such as a device or an area beside the system 100.

The heat dissipating layer 106 may comprise, for example, various materials, such as materials with a high thermal conductivity and a low electrical conductivity, such as silicon nitride (SiN), silicon carbide (SiC), diamond-like carbon materials, etc., and may be coupled to a heat sink or a substrate, such as a silicon substrate. Silicon carbide is generally harder than silicon nitride and may have slightly more than twice the thermal conductivity. The electrical conductors 104, 112 may comprise, for example, a metallic conductive layer, such as, for example, aluminum or an aluminum alloy, copper, other metals and alloys, etc. The N-type and P-type semiconductor regions may comprise, for example, doped silicon, etc. The doping of the N-type and P-type regions may be at various levels and need not be uniform throughout a region. The various regions and layers may be, for example, formed, deposited, positioned or grown. Various techniques, such as etching, etc., may be employed.

Figure 2:
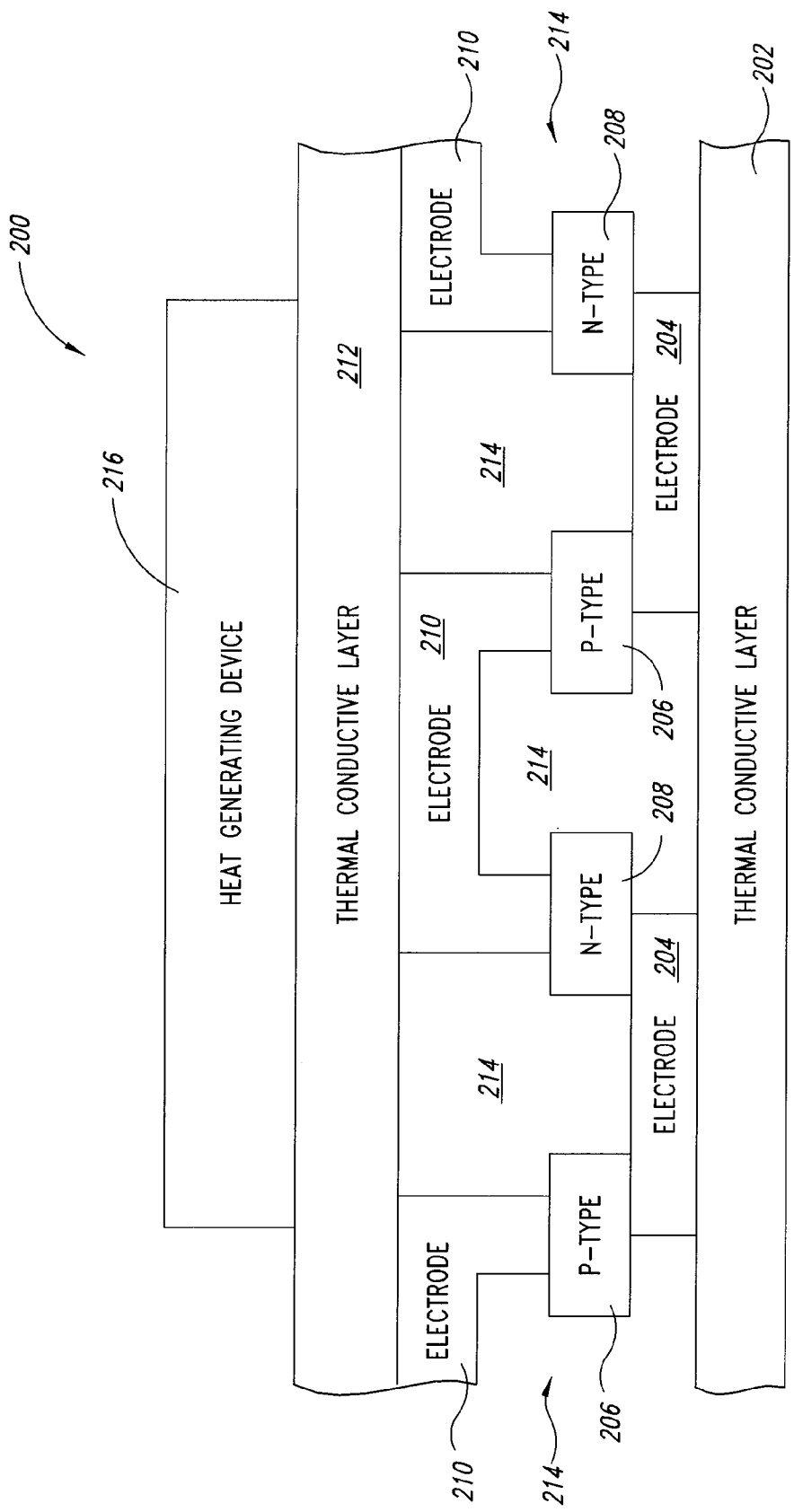
FIG. 2 is a side cut-away cross-sectional view of an embodiment of a TEC device.

FIG. 2 is a side cut-away cross-sectional view of a TEC device 200. The TEC 200 has a first thermal conductive layer 202 with a high thermal conductivity and a low electrical conductivity. For example, thin-film materials with a high thermal conductivity and a low electrical conductivity may be used for the first thermal conductive layer 202. For example, silicon nitride, etc., may be employed. One or more electrodes 204 are positioned on the first thermal conductive layer 202. For example, the electrodes 204 may be formed or glued on the first thermal conductive layer 202. A thermally conductive glue may be employed. A plurality of P-type semiconductor regions 206 are electrically coupled to the electrodes 204, for example, positioned or formed on the electrodes 204. A plurality of N-type semiconductor regions 208 are coupled to the electrodes 204, for example, positioned or formed on the electrodes 204. One or more electrodes 210 are coupled to the other sides of the P-type and N-type semiconductors 206, 208, forming a plurality of P/N junctions. A second thermal conductive layer 212 is positioned or formed on the electrodes 210. The second thermal conductive layer may comprise, for example, a thin-film material with a high thermal conductivity and a low electrical conductivity. For example, silicon nitride, silicon carbide, etc., may be employed. The first and second thermal conductive layers 202, 212, the electrodes 204, 210, and the P-type 206 and N-type 208 regions are positioned such that gaps or regions 214 exist between the various components. In some embodiments, the regions 214 may be filled with air. In some embodiments, a material, such as a dielectric material, may be positioned or formed in the regions 214. For example, a dielectric material with a low thermal conductivity, such as polyimide, parylene, silicon dioxide, Benzocyclobutane (BCB), etc., may be employed. The TEC 200 may be employed to cool one or more heat generating devices, such as the illustrated heat generating device 216.

Figure 3:
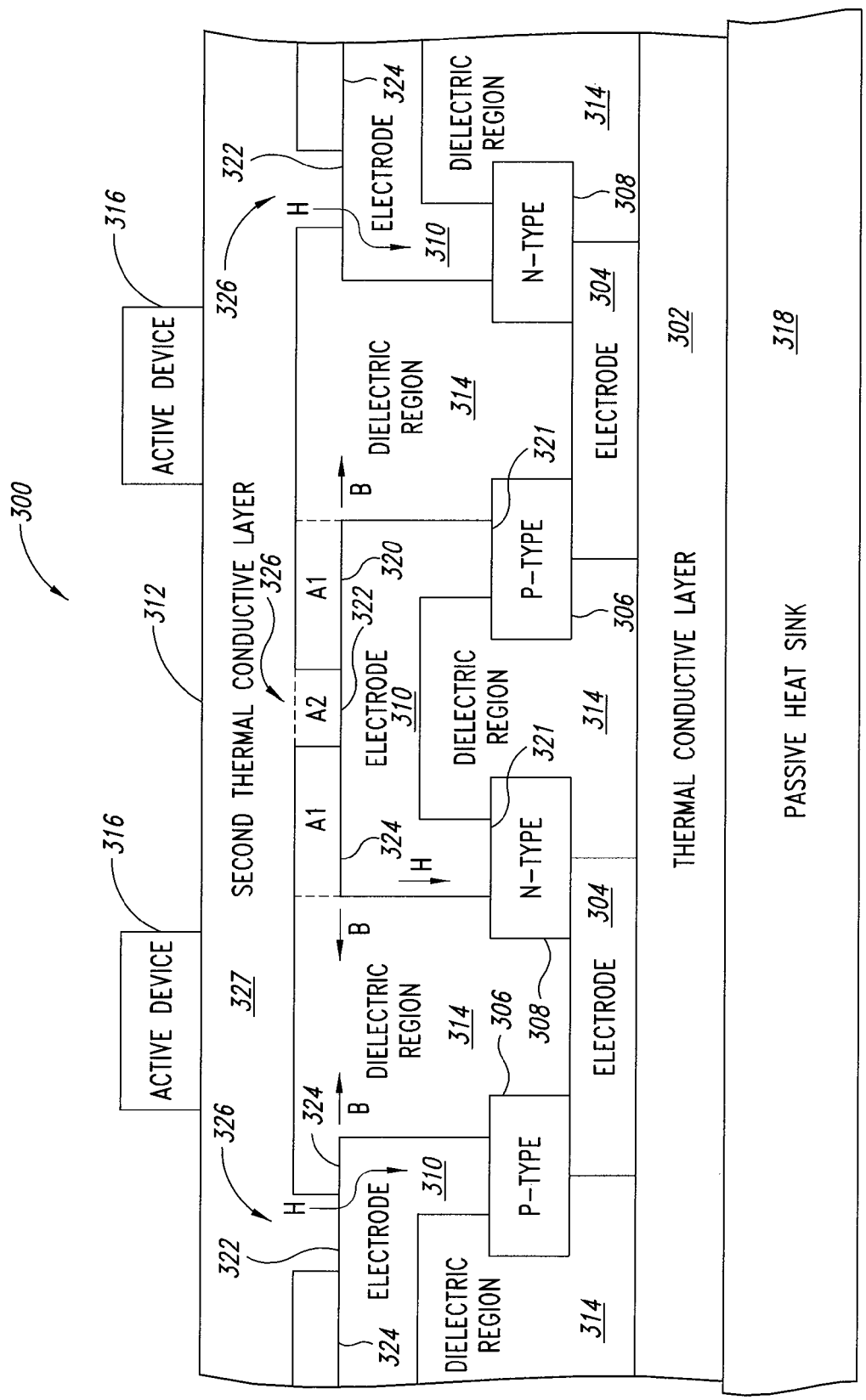
FIG. 3 is a cross-sectional cut-away view of an embodiment of a TEC system.

FIG. 3 is a cross-sectional cut-away view of an embodiment of a TEC system 300. The TEC 300 comprises a first thermal conductive layer 302 with a high thermal conductivity and a low electrical conductivity. For example, dielectric materials such as thin-film materials may be used for the first thermal conductive layer 302. For example, silicon nitride, silicon carbide, etc., may be employed. One or more electrodes 304 are positioned on the first thermal conductive layer 302. For example, the electrodes 304 may be formed or glued on the first thermal conductive layer 302. For example, a thermally conductive glue may be employed. A plurality of P-type semiconductor regions 306 are coupled to the electrodes 304, for example, positioned or formed on the electrodes 304. A plurality of N-type semiconductor regions 308 are coupled to the electrodes 304, for example, positioned or formed on the electrodes 304. One or more electrodes 310 are coupled to sides of the P-type and N-type semiconductor regions 306, 308 opposite to the sides coupled to the electrodes 304. A second thermal conductive layer 312 is positioned or formed on the electrodes 310. The second thermal conductive layer 312 may comprise, for example, a dielectric such as a thin-film material. For example, silicon nitride, silicon carbide, etc. Regions of a second dielectric material 314 are formed or positioned between the thermal conductive layers 302, 312, the electrodes 304, 310, the P-type semiconductors 306 and the N-type semiconductors 308. For example, a dielectric material with a low thermal conductivity, such as a polymer, for example polyimide, parylene, Benzocyclobutane, etc., or an oxide, such as silicon dioxide, etc., may be employed in the regions 314 of the second dielectric material. The TEC 300 may be employed to cool one or more heat generating devices, such as the illustrated active devices 316, and may employ an optional heat dissipation device, which may be passive, such as the illustrated heat sink 318 or active, such as a fan (not shown). Combinations of heat dissipating devices may be employed, including combinations of passive and active heat dissipating devices.

As shown in FIG. 3, the electrodes 310 coupling the P-type regions 306 to the N-type regions 308 have a surface 320, opposite of surfaces 321 coupled to respective semiconductor regions 306, 308. The surface 320 is partially in contact with the second thermal conductive layer 312. As illustrated, a region 322 of the surface 320 of the electrodes 310 is in contact with a leg or thermal channel 326 of the second thermal conductive layer 312, and one or more other regions 324 of the surfaces 320 of the electrodes 310 are not in contact with the second thermal conductive layer 312. The thermal channels 326 of the second thermal conductive layer 312 extend from a main or connecting portion 327 of the thermal conductive layer 312 and are separated by regions of the second dielectric material 314. As illustrated, the electrode 310 has an area A1 of the second dielectric material 314 on the surface 320 and an area A2 of the second thermal conductive layer 312 on the surface 320 of the electrode 310. Having an area A1 of the surface 320 of the electrode 310 that is in contact with a second dielectric (such as the dielectric 314) instead of with the second thermal conductive layer 312 impacts the thermal retention properties of the device, and varying the ratio of the area of A1 of the second dielectric material 314 in contact with the surface 320 of the electrode 310 to the area A2 of the second thermal conduction layer 312 in contact with the surface 320 of the electrode 310 may impact the direction and/or efficiency of heat transfer. For example, when the dielectric 314 has a lower thermal conductivity than the second thermal conductive layer 312, increasing the ratio of the area A1 to the area A2 tends to increase the channeling of heat from the second thermal conductive layer 312 to the first thermal conductive layer through the electrode 310, as illustrated by the arrow H, while reducing the transfer of heat in the direction indicated by the arrow B in FIG. 3. An embodiment may have a dielectric layer with a thermal conductivity at least one or two orders of magnitude less that a thermal conductivity of the thermally conductive layers. For example, silicon nitride may have a thermal conductivity of 30 W/mK and polyimide may have a thermal conductivity of 0.12-0.14 W/mK. A uniform ratio of the area A1 to the area A2 may be employed in some embodiments, or the ratio of the area A1 to the area A2 may vary. In some embodiments, the dielectric region 314 may not extend on the surface 320 of the electrodes 310. In other words, the area A1 may be omitted in some embodiments.

As noted above, FIG. 3 is a cross-sectional view of an embodiment of a TEC system 300. The illustrated features of the TEC 300 are not necessarily rectilinear and may have various shapes. For example, the P-type regions 306 or the N-type regions 308, or both, may be substantially cylindrical in shape. In another example, the thermal channels or legs 326 of the second thermal conduction layer 312 may be substantially cylindrical or elliptical, etc., in shape.

Figure 4:
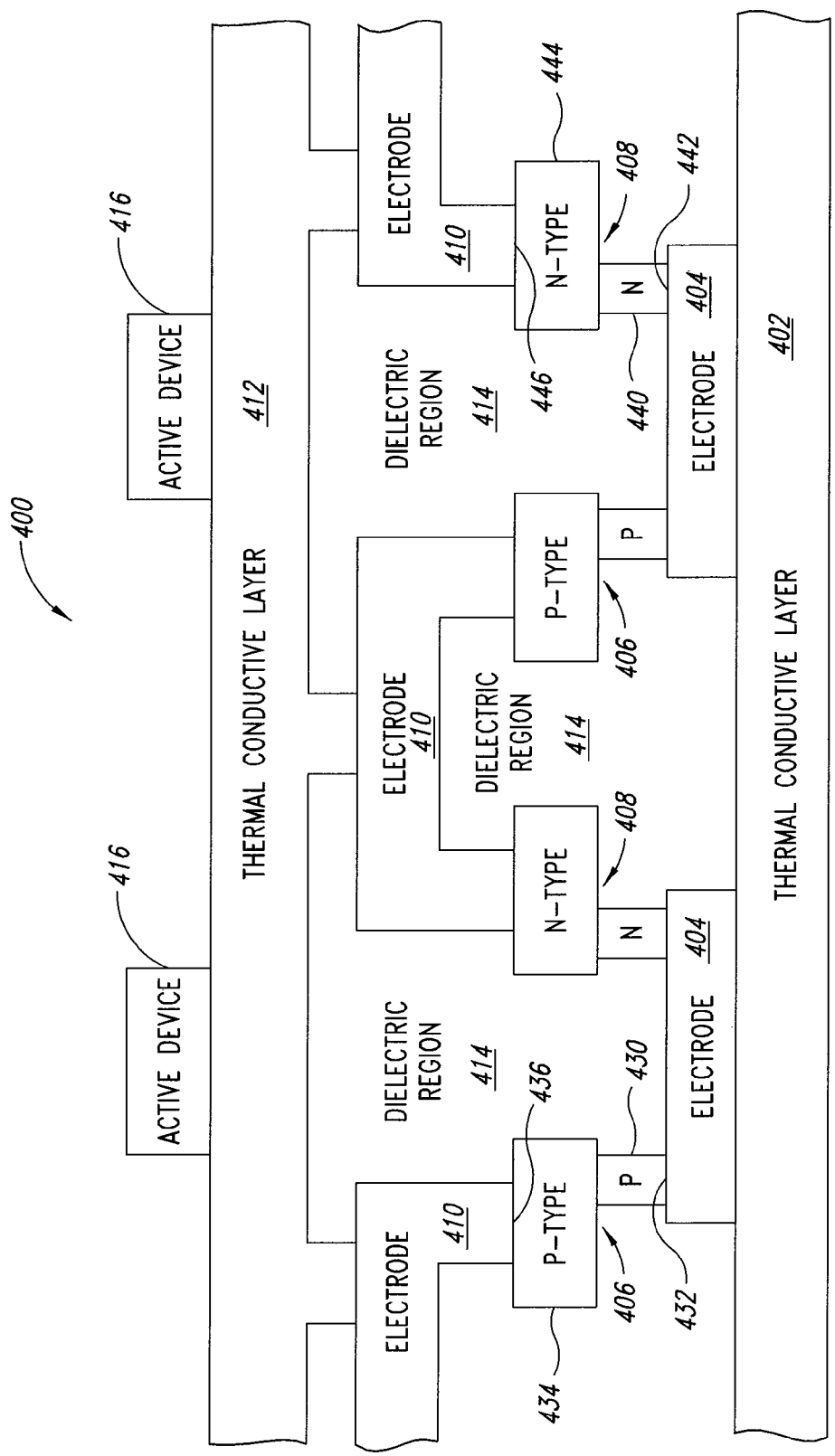
FIG. 4 is a cross-sectional cut-away view of an embodiment of a TEC system.

FIG. 4 is a cross-sectional cut-away view of an embodiment of a TEC system 400. The TEC 400 comprises a first thermal conductive layer 402 with a high thermal conductivity and a low electrical conductivity. For example, dielectric materials such as thin-film dielectric materials may be used for the first thermal conductive layer 402. For example, silicon nitride, silicon carbide, etc., may be employed. One or more first electrodes 404 are positioned on the first thermal conductive layer 402. For example, the first electrodes 404 may be formed or glued on the first thermal conductive layer 402. For example, a thermally conductive glue may be employed. A plurality of P-type semiconductor regions 406 are coupled to the first electrodes 404, for example, positioned or formed on the first electrodes 404. A plurality of N-type semiconductor regions 408 are coupled to the first electrodes 404, for example, positioned or formed on the first electrodes 404. One or more second electrodes 410 are coupled to the P-type and N-type semiconductor regions 406, 408 to form P/N junctions. A second thermal conductive layer 412 is positioned or formed on the second electrodes 410. The second thermal conductive layer 412 may comprise, for example, a dielectric such as a thin-film dielectric material. For example, silicon nitride, silicon carbide, etc. may be employed. Regions of a second dielectric material 414 may be formed or positioned between the thermal conductive layers 402, 412, the first and second electrodes 404, 410, the P-type semiconductors 406 and the N-type semiconductors 408. For example, a dielectric material with a low thermal conductivity, such as a polymer or an oxide, etc., may be employed in the regions of the second dielectric material 414. For example, polymers such as polyimide, parylene, Benzocyclobutane (BCB), etc., or oxides such as silicon dioxide, etc., may be employed. The TEC 400 may be employed to cool one or more heat generating devices, such as the illustrated active devices 416, which may be, for example, a graphics card controller, etc. The TEC 400 may employ an optional heat dissipation device, which may be passive, such as a heat sink (see heat sink 318 of FIG. 3) or active, such as a fan (not shown). Combinations of heat dissipating devices may be employed, including combinations of passive and active heat dissipating devices.

As shown in FIG. 4, the P-type regions 406 have a first surface 432 at least partially in contact with a first electrode 404, and a second surface 436 opposite the first surface 432. The second surface 436 is at least partially in contact with a second electrode 410. As illustrated, the P-type regions 406 comprise two portions, a first portion 430 having the first surface 432 coupled to a first electrode 404 and a second portion 434 having the second surface 436 coupled to a second electrode 410. The second surface 436 of the P-type region 406 has an area different from an area of the first surface 432 of the P-type region 406, as discussed in more detail below. As shown in FIG. 4, the N-type regions 408 have a first surface 442 at least partially in contact with a first electrode 404, and a second surface 446 opposite the first surface 442. The second surface 446 is at least partially in contact with a second electrode 410. As illustrated, the N-type regions 408 comprise two portions, a first portion 440 having the first surface 442 coupled to a first electrode 404 and a second portion 444 having the second surface 446 coupled to a second electrode 410. The second surface 446 of the N-type region 408 has an area different from an area of the first surface 442, as discussed in more detail below. As illustrated, the first portion 430 of the P-type region 406 has a different shape than the second portion 434 of the P-type region 406, and the P-type region 406 generally has a T-shape. Similarly, as illustrated the first portion 440 of the N-type region 408 has a different shape than the second portion 444 of the N-type region 408, and the N-type region 408 generally has a T-shape. In addition to T-shapes, other shapes may be employed, such as inverted L-shapes, etc. (see, for example, FIGS. 7A through 9C below).

In some embodiments, the various portions of the P-type and N-type regions may be separately formed and/or may have different doping levels.

As noted above, FIG. 4 is a cross-sectional view of an embodiment of a TEC system 400. The illustrated features of the TEC 400 are not necessarily rectilinear and may have various shapes. For example, the portions 430, 434 of the P-type regions 406 or the portions 440, 444 of the N-type regions 408, or both, may be substantially cylindrical, etc., in shape.

Varying the configurations of the P-type regions and/or the N-type regions modifies the performance of a TEC. For example, modifying the shape of semiconductor regions, for a given volume of material in the region, may change the difference in temperature that can be achieved between the junctions of a TEC array, such as the system 400 of FIG. 4.

Figure 5:
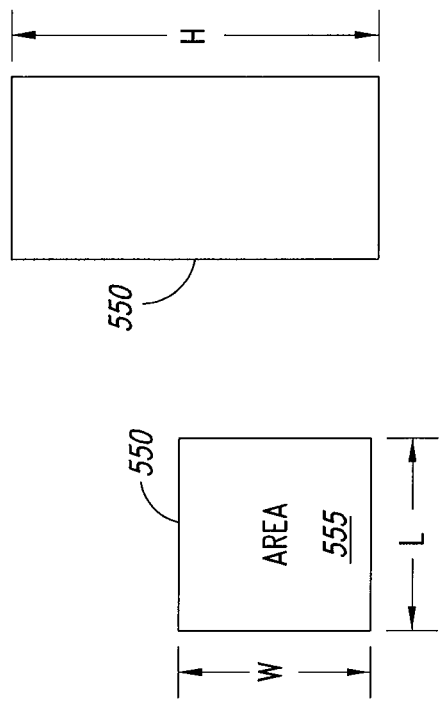
FIG. 5 shows a top and side view of an embodiment of a generally uniformly-shaped doped semiconductor region.

FIG. 5 shows a top and side view of a generally uniformly-shaped semiconductor region 550, for example, a P-type semiconductor region 306 or an N-type semiconductor region 308 of FIG. 3. The semiconductor region 550 has a length L and a width W which define an area 555 of the top and of the bottom of the semiconductor region 550, as shown in the top view. The semiconductor region 550 also has a height H as shown in the side view. The length L, the width W and the height H define a volume of the semiconductor region 550. Although as illustrated the height H is greater than the length L and the width W, and the length and width have a same magnitude, embodiments may employ lengths, widths and heights with other relationships between the respective magnitudes.

Figure 6:
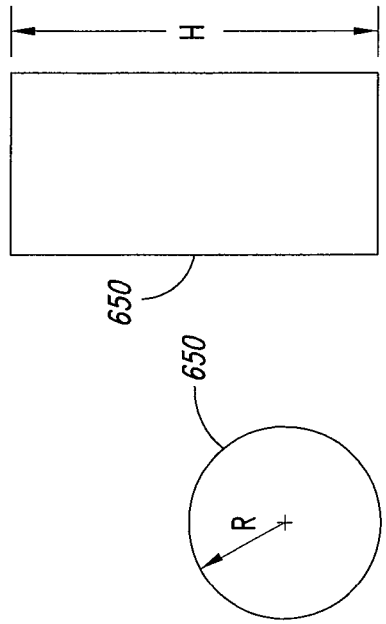
FIG. 6 shows a top and side view of an embodiment of a generally uniformly-shaped doped semiconductor region.

FIG. 6 shows a top and side view of another generally uniformly-shaped semiconductor region 650, for example, a P-type semiconductor region 306 or an N-type semiconductor region 308 of FIG. 3. The semiconductor region 650 has a radius R which defines an area of the top and of the bottom of the semiconductor region 650, as shown in the top view. The semiconductor region 650 also has a height H, as shown in the side view. The radius R and the height H define a volume of the semiconductor region 650. Although as illustrated the height H is greater than the radius R, embodiments may employ other relationships between the respective magnitudes of the height and radius.

Figure 7B:
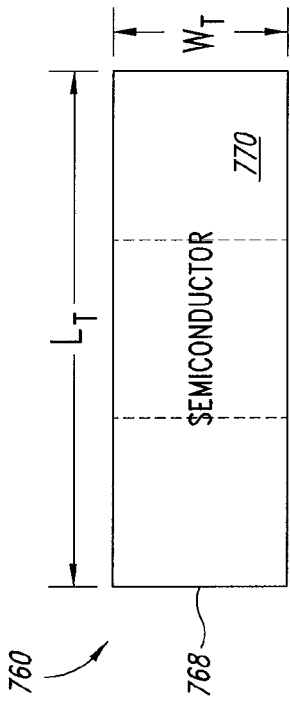
FIGS. 7A to 7C show, respectively, a side, top and bottom view of an embodiment of a generally T-shaped semiconductor region.
Figure 7C:
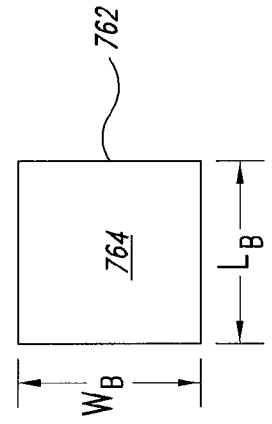
Figure 7A:
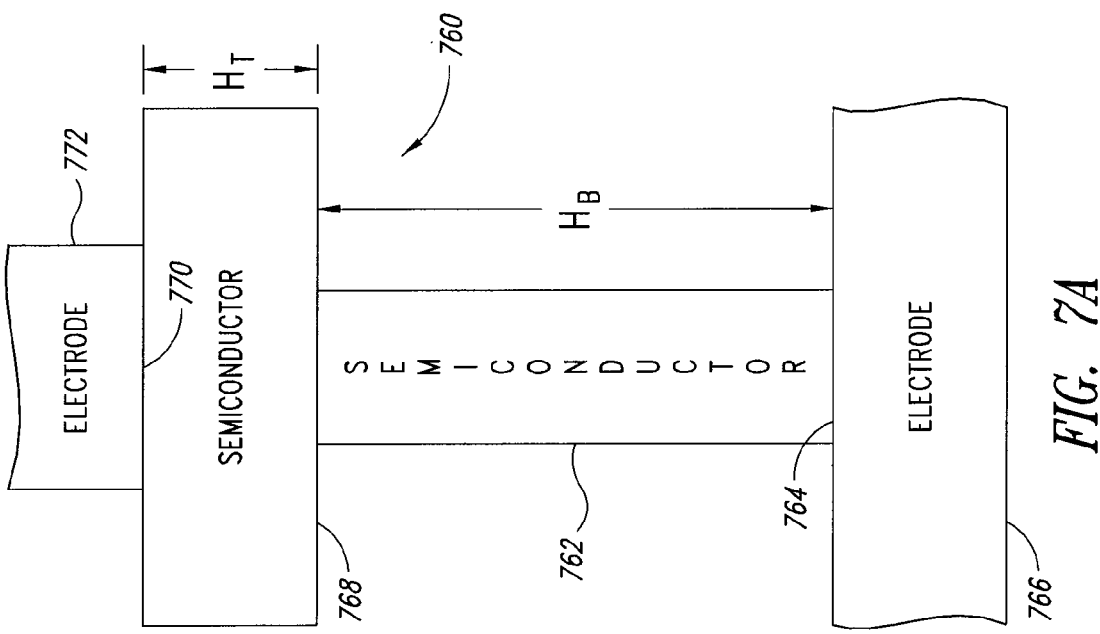

FIGS. 7A to 7C show, respectively, a side, top and bottom view of an embodiment of a generally T-shaped semiconductor region 760 having a first portion 762 with a first surface 764 at least partially in contact with a first electrode 766, and a second portion 768 with a second surface 770, opposite of the first surface 764, and at least partially in contact with a second electrode 772. For ease of illustration, the first portion 762 is shown in dashed lines in the top view of FIG. 7B, and the second portion 768 is omitted from the bottom view of FIG. 7C. As illustrated, the first portion 762 has a thickness or height $H_B$, a width $W_B$ and a length $L_B$. The second portion 768 has thickness or height $H_T$, a width $W_T$ and a length $L_T$. An area of the first surface 764 is defined by the width $W_B$ and the length $L_B$, and a volume $V_B$ of the first portion 762 is defined by the height $H_B$, the width $W_B$ and the length $L_B$. An area of the second surface 770 is defined by the width $W_T$ and the length $L_T$, and a volume $V_T$ of the second portion 768 is defined by the height $H_B$, the width $W_B$ and the length $L_B$. The illustrated lengths, widths, and heights may have various relative magnitudes. For example, as illustrated the first surface 764 has an area smaller than an area of the second surface 770, and the first portion 762 and the second portion 768 have a same volume. In some embodiments, for example, the width $W_B$ of the first portion 762 may be different from the width $W_T$ of the second portion 768. In addition, the first portion 762 need not be centered with respect to the second portion 768, and may, for example, be offset to form, for example, a generally T-shaped semiconductor region 760, or an inverted L-shaped semiconductor region 760.

FIGS. 8A and 8B show, respectively, a side and top view of an embodiment of a generally T-shaped semiconductor region 860 having a first portion 862 with a first surface 864 at least partially in contact with a first electrode 866, and a second portion 868 with a second surface 870, opposite of the first surface 864, and at least partially in contact with a second electrode 872. For ease of illustration, the position of first portion 862 below the second portion 868 is shown using dashed lines in the top view of FIG. 8B. As illustrated, the first portion 862 has a thickness or height $H_B$ and a radius $R_B$. The second portion 868 has thickness or height $H_T$ and a radius $R_T$. An area of the first surface 864 is defined by the radius $R_B$, and a volume $V_B$ of the first portion 862 is defined by the radius $R_B$ and the height $H_B$. An area of the second surface 870 is defined by the radius $R_T$, and a volume $V_T$ of the second portion 868 is defined by the radius $R_T$ and the height $H_T$. The illustrated radii and heights may have various relative magnitudes. In addition, the first and second portions 862, 868 need not be cylindrical. For example, the first surface 864 and/or the second surface may be elliptical, etc., and thus have an area defined by two or more radii instead of a single radius.

As illustrated the first surface 864 has an area smaller than an area of the second surface 870. In addition, the first portion 862 need not be offset with respect to the second portion 868, and may, for example, be centered or aligned with, or extend beyond, an edge of the second portion.

Figure 9C:
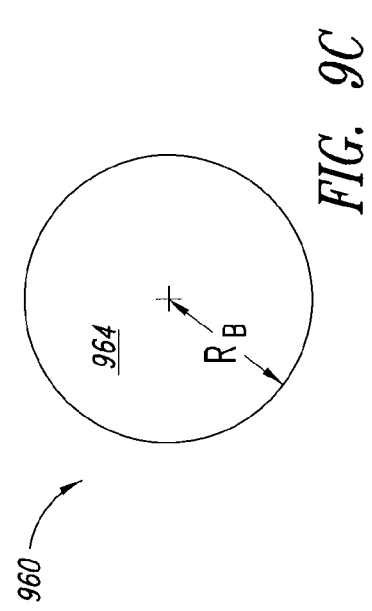
FIGS. 9A to 9C show, respectively, a side, top and bottom view of an embodiment of a semiconductor region.
Figure 9B:
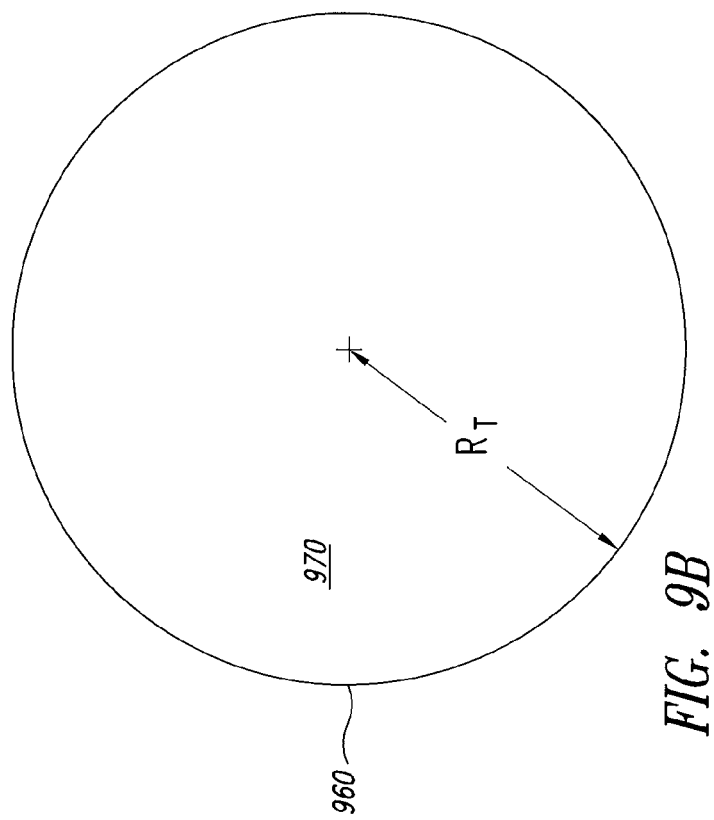
Figure 9A:
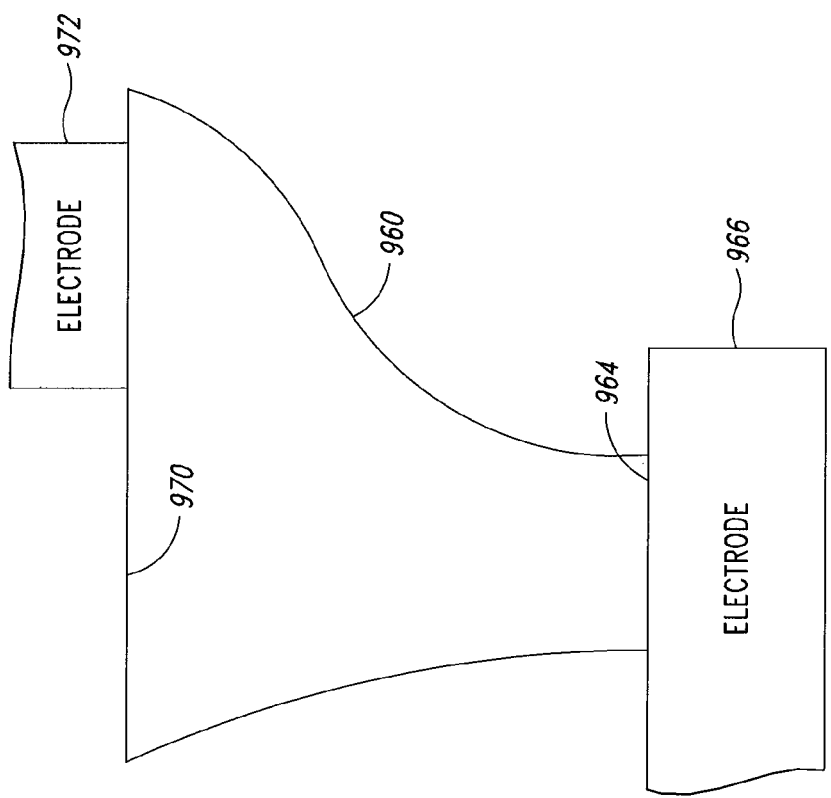

FIGS. 9A to 9C show, respectively, a side, top and bottom view of an embodiment of a semiconductor region 960 having a first surface 964 at least partially in contact with a first electrode 966, and a second surface 970, opposite of the first surface 964, and at least partially in contact with a second electrode 972. As illustrated, the first surface 964 has a radius $R_B$ defining an area of the first surface 964, and the second surface 970 has a radius $R_T$ defining an area of the second surface 970. Other shapes may be employed for a semiconductor region having a first surface with a first dimension having a magnitude, such as a length of a first magnitude, and a second surface opposite the first surface with a corresponding dimension, such as a length, of a second magnitude different from a the first magnitude.

Figure 10:
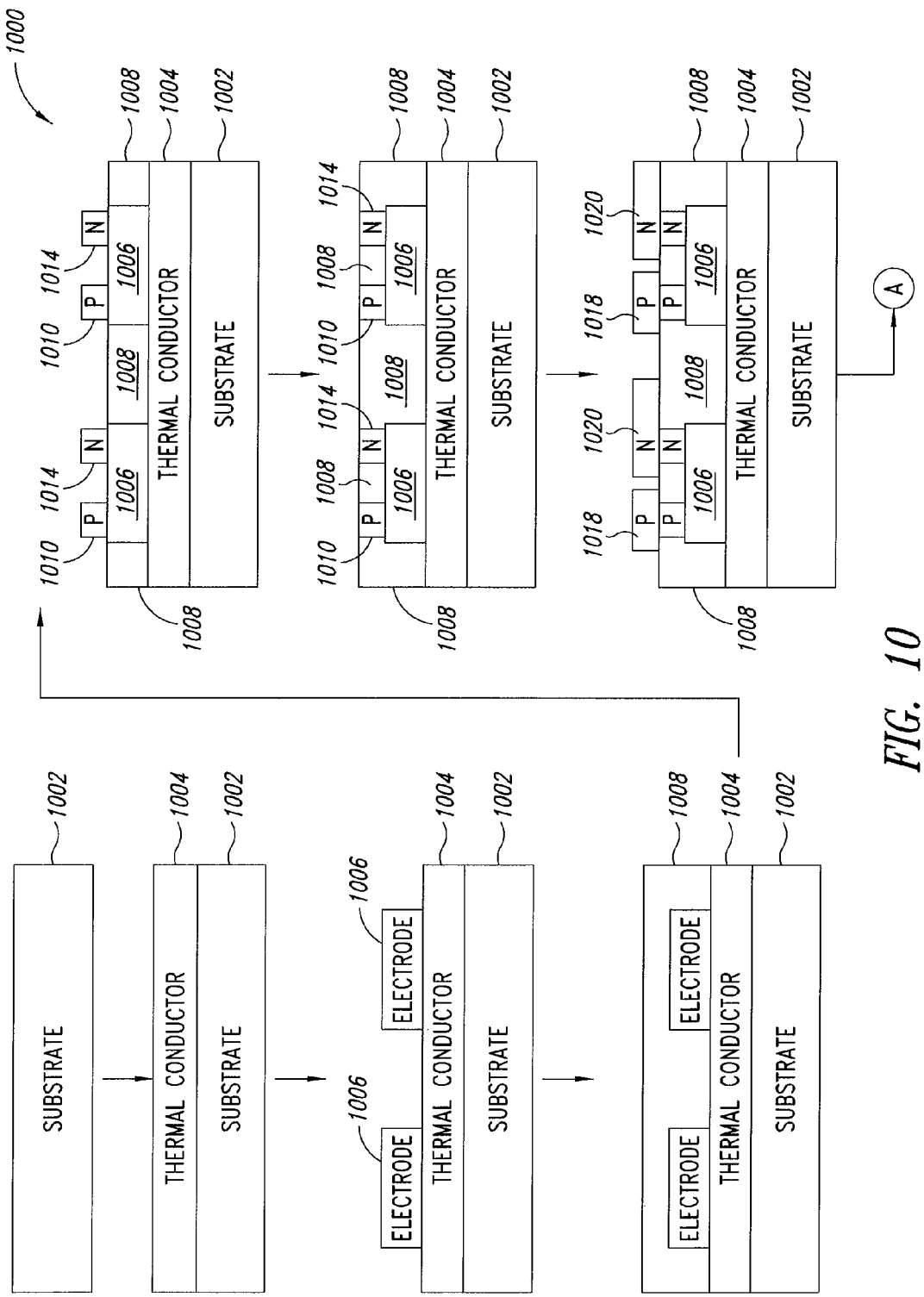
FIGS. 10 through 12 illustrate an embodiment of a method of making a TEC system.
Figure 11:
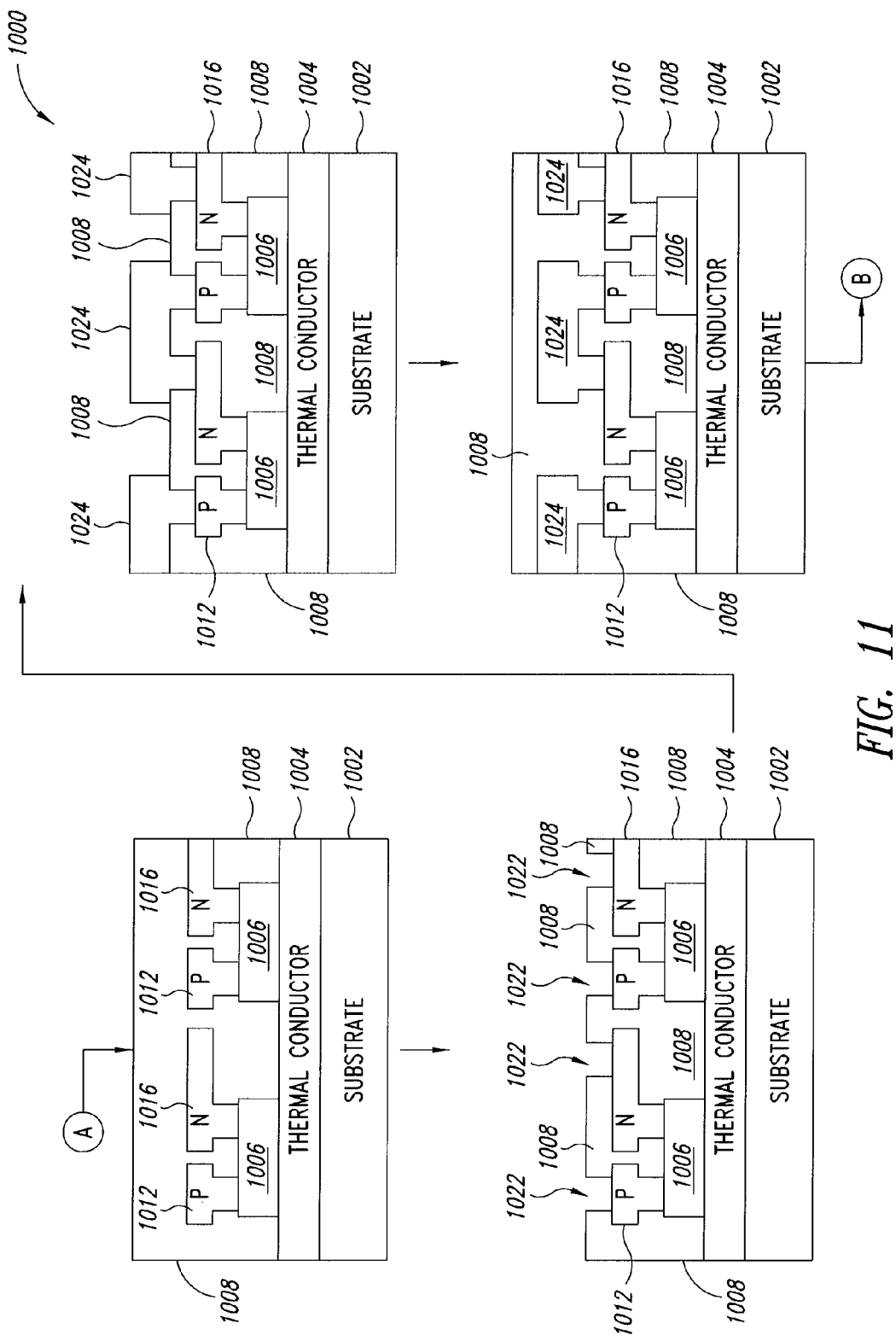
Figure 12:
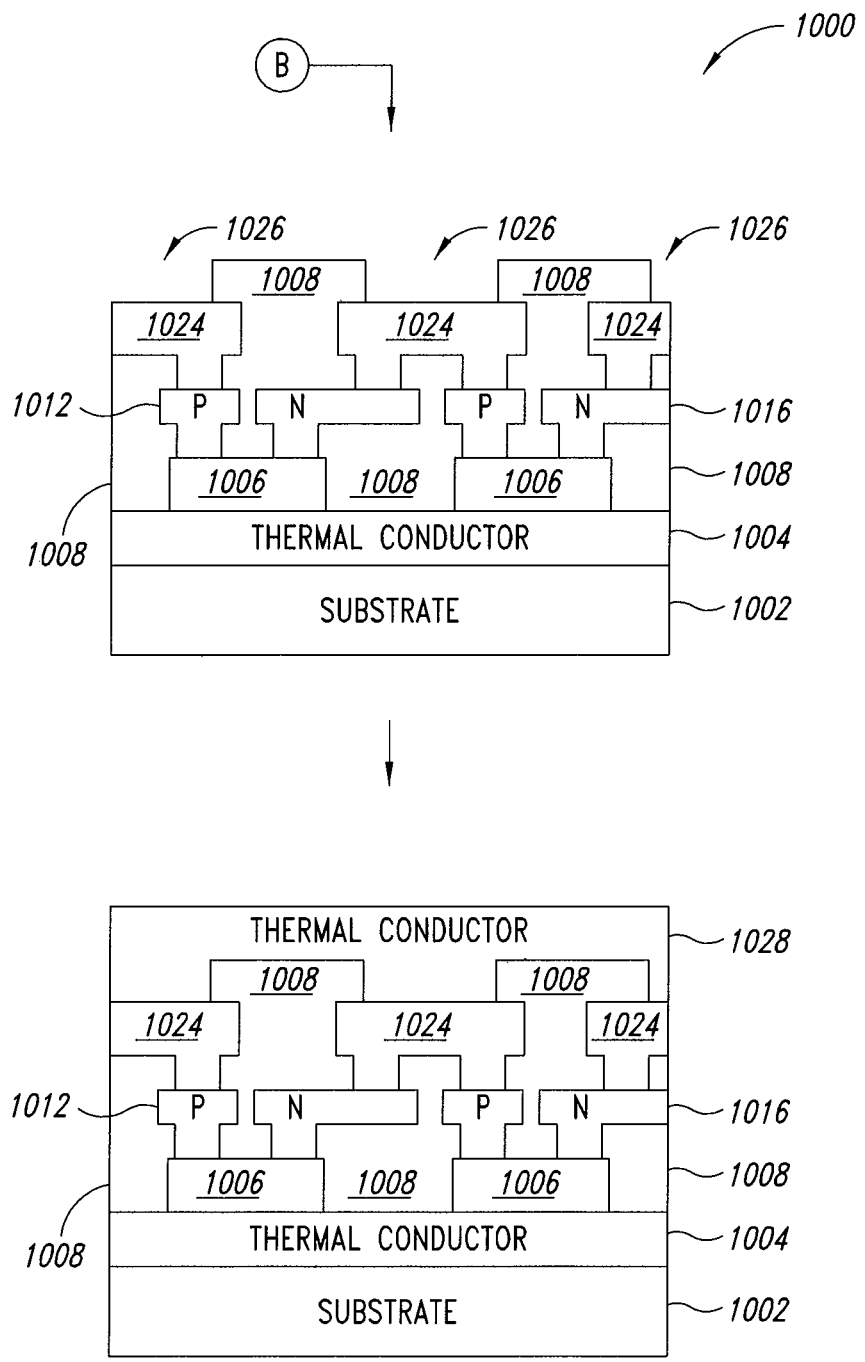

FIGS. 10 through 12 illustrate an embodiment of a method 1000 of making a TEC system, such as the TEC system including features of the embodiment of a TEC system 300 illustrated in FIG. 3 and of the embodiment of a TEC system 400 illustrated in FIG. 4, using planar thin film techniques. A substrate 1002 is obtained or formed. For example, a silicon substrate may be employed. A first thermally conductive layer 1004 is formed or positioned on the substrate 1002. For example, the first thermally conductive layer 1004 may comprise a dielectric such as silicon nitride deposited on the substrate 1002. Bottom electrodes 1006 are positioned on the first thermally conductive layer 1004. For example, aluminum or other metals or metallic alloys may be deposited or formed in various patterns on the first thermally conductive layer 1004. A layer of a first dielectric material 1008 is positioned on the thermally conductive layer 1004 between the bottom electrodes 1006. The first dielectric material may have a low thermal conductivity, for example, polymers, such as polyimide, parylene or BCB, etc., or oxides, such as silicon dioxide, etc., may be employed. As illustrated, the layer of the first dielectric material 1008 covers the bottom electrodes 1006, and the excess dielectric material covering the bottom electrodes is then removed (not shown), for example, in a known manner.

First portions 1010 of P-type semiconductor regions 1012 and first portions 1014 of N-type semiconductor regions 1016 are positioned on the bottom electrodes 1006. An additional layer of the first dielectric material 1008 is positioned between the first portions 1010 of the P-type regions 1012 and the first portions 1014 of the N-type regions 1016. Second portions 1018 of P-type semiconductor regions 1012 are positioned on the first portions 1010 of the P-type semiconductor regions and second portions 1020 of N-type semiconductor regions 1016 are positioned on the first portions 1014 of the N-type semiconductor regions 1016. An additional layer of the first dielectric material 1008 is positioned on the P-type semiconductor regions 1012 and on the N-type semiconductor regions 1016. Contact patterns 1022 are formed, for example, by masking and etching.

Top electrodes 1024 are positioned or formed on the P-type semiconductor regions 1012 and the N-type semiconductor regions 1016. An additional layer of the first dielectric material 1008 is positioned on the top electrodes 1024. Heat channels 1026 are formed on the top electrodes 1024, for example by masking and etching the layer of the first dielectric material 1008 on the top electrodes 1024. A second thermally conductive layer 1028 is positioned or formed on the top electrodes 1024 and the first dielectric material 1008. The second thermally conductive layer 1028 has thermal channels (see thermal channels 326 of FIG. 3) extending from a main or connecting portion of the second thermal conductive layer (see main portion 327 of FIG. 2) through the heat channels 1026 to a surface of the top electrodes 1024.

Embodiments of TEC systems and devices, such as the embodiment 300 of FIG. 3 and the embodiment 400 of FIG. 4, may be coupled to one or more devices or regions to be cooled, or may be integrated into an integrated circuit having one or more components or regions to be cooled. For example, with reference to FIG. 12, one or more active components or passive components may be positioned or formed on top of the second thermally conductive layer 1028.

Embodiments of methods of making TEC devices, integrated circuits and systems may include additional steps not shown in FIGS. 10-12, may not include all of the steps shown in FIGS. 10-12, and may perform steps in various orders and in accordance with various protocols. For example, sacrificial layers may be employed in some embodiments. In another example, the steps may occur at temperatures lower than 400 degrees Celsius.

The use of planar thin film technologies as discussed herein facilitates much smaller TEC devices. For example, a conventional bulk-metal molding TEC having an area of 16 cm$^2$ may be replaced by a planar thin-film TEC having an area of approximately 0.5 cm$^2$.

Figure 13:
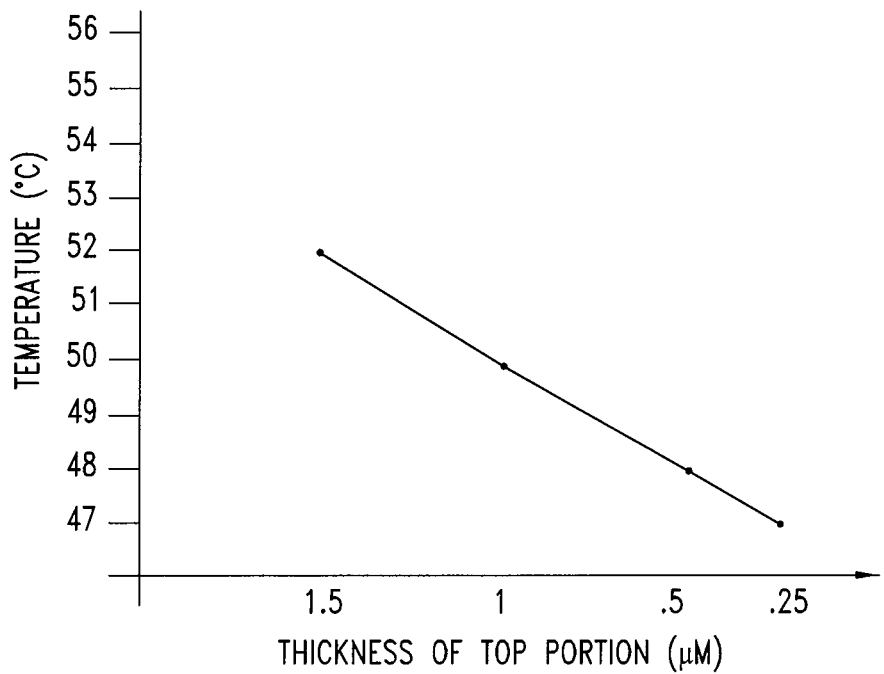
FIG. 13 shows results of a simulation of an embodiment of a TEC system.

Various thicknesses may be employed for the first and second portions of the semiconductor regions, such as portions 762, 768, 862 and 868 of FIGS. 7 and 8. For example, ranges between 2 micrometers and 0.25 micrometers may be employed. Varying the relative thickness of the first and second portions may impact the temperature difference that may be maintained between the first and second electrodes. For example, in simulations, having the second portion being thicker with respect to the first portion generally produced a greater temperature difference between the electrodes. The results of one simulation are shown in FIG. 13. With an overall thickness of the P-type and N-type semiconductor regions (such as region 760) of two micrometers, when a thickness of a top portion (such as portion 768 of FIG. 7) was 1.5 micrometers, the temperature difference between a top electrode (such as electrode 772 of FIG. 7) and a bottom electrode (such as electrode 766 of FIG. 7) was estimated at approximately 52 degrees Celsius. With a thickness of a top portion of 1.0 micrometers, and a bottom portion of 1.0 micrometers, the temperature difference was estimated at approximately 50 degrees Celsius. With a thickness of a top portion of 0.5 micrometers, and a bottom portion of 1.5 micrometers, the temperature difference was estimated at approximately 48 degrees Celsius. With a thickness of a top portion of 0.25 micrometers, and a bottom portion of 1.75 micrometers, the temperature difference was estimated at approximately 47 degrees Celsius.

Figure 14:
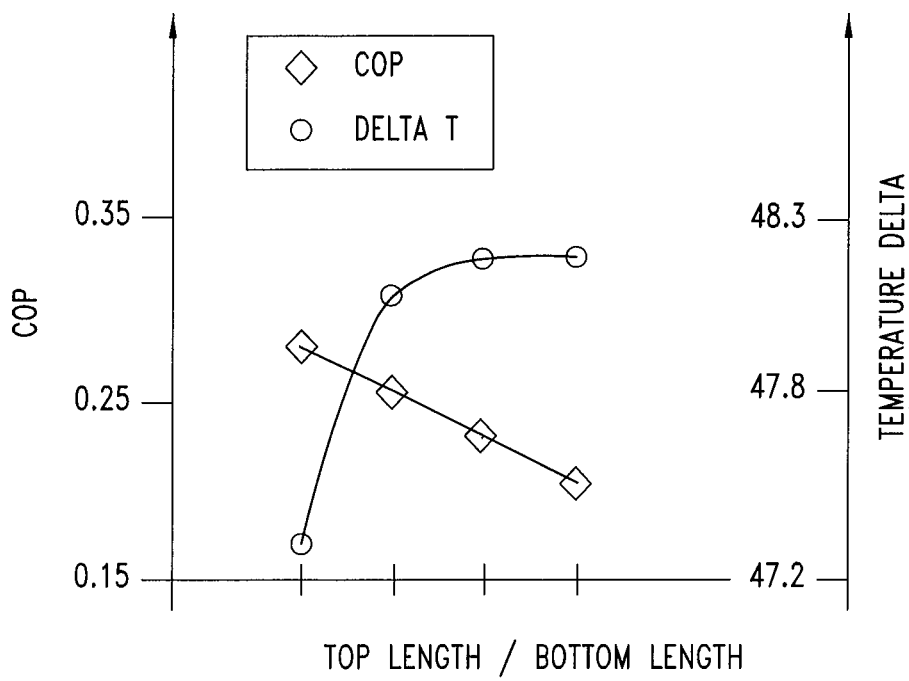
FIG. 14 shows results of a simulation of an embodiment of a TEC system.

Various lengths or radii may be employed for the first and second portions of the semiconductor regions, such as portions 762, 768, 862 and 868. Varying the relative lengths or radii of the first and second portions may impact the temperature difference that may be maintained between the first and second electrodes and the coefficient of performance for the TEC, with the coefficient of performance defined by as the total cooling power divided by the electric power consumed. In a simulation, the coefficient of performance generally decreased as the ratio of the length of the second portion to the length of the first portion increased. Conversely, the temperature difference that could be maintained increased as the ratio of the length of the second portion to the length of the first portion increased. FIG. 14 shows the results for a simulation.

Figure 15:
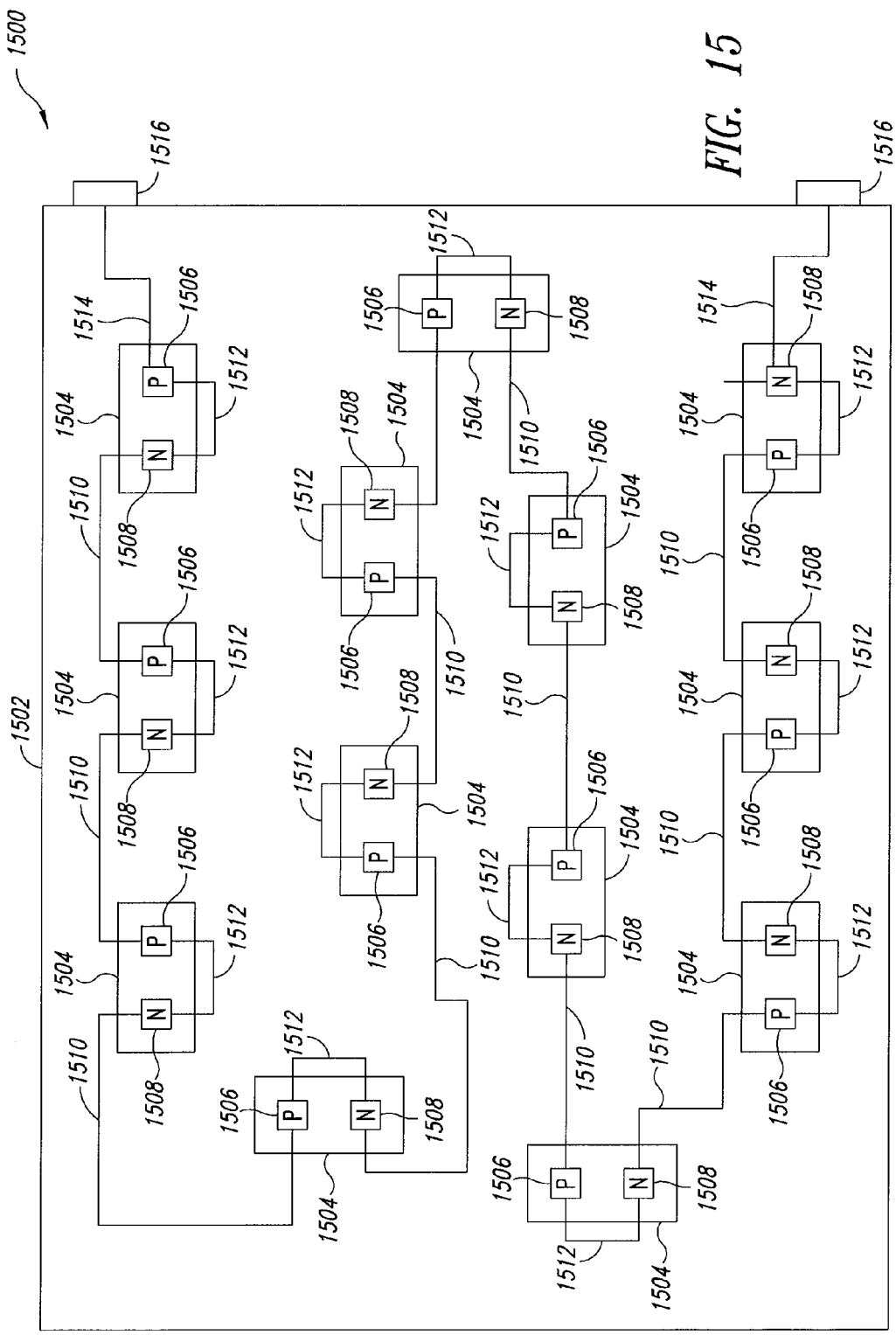
FIG. 15 is a functional block diagram of an embodiment of a TEC system.

FIG. 15 is a functional block diagram of an embodiment of a TEC device 1500. The TEC 1500 comprises a semiconductor die 1502 having a plurality of unit cells 1504 each having a P-type semiconductor region 1506 and an N-type semiconductor region 1508. First conductors 1510 couple P-type semiconductor regions 1506 of one unit cell 1504 to N-type semiconductor regions 1508 of an adjacent unit cell 1504. Second conductors 1512 couple P-type semiconductor regions 1506 of a unit cell to N-type semiconductor regions 1508 of a same unit cell 1504. Leads 1514 couple the unit cells 1504 to bonding pads 1516 on the die 1502. Although FIG. 15 illustrates 13 unit cells 1504, a TEC may comprises many thousands of unit cells, such as unit cells 1504. A unit cell 1504 may have an area of, for example, 6 square micrometers.

Figure 16:
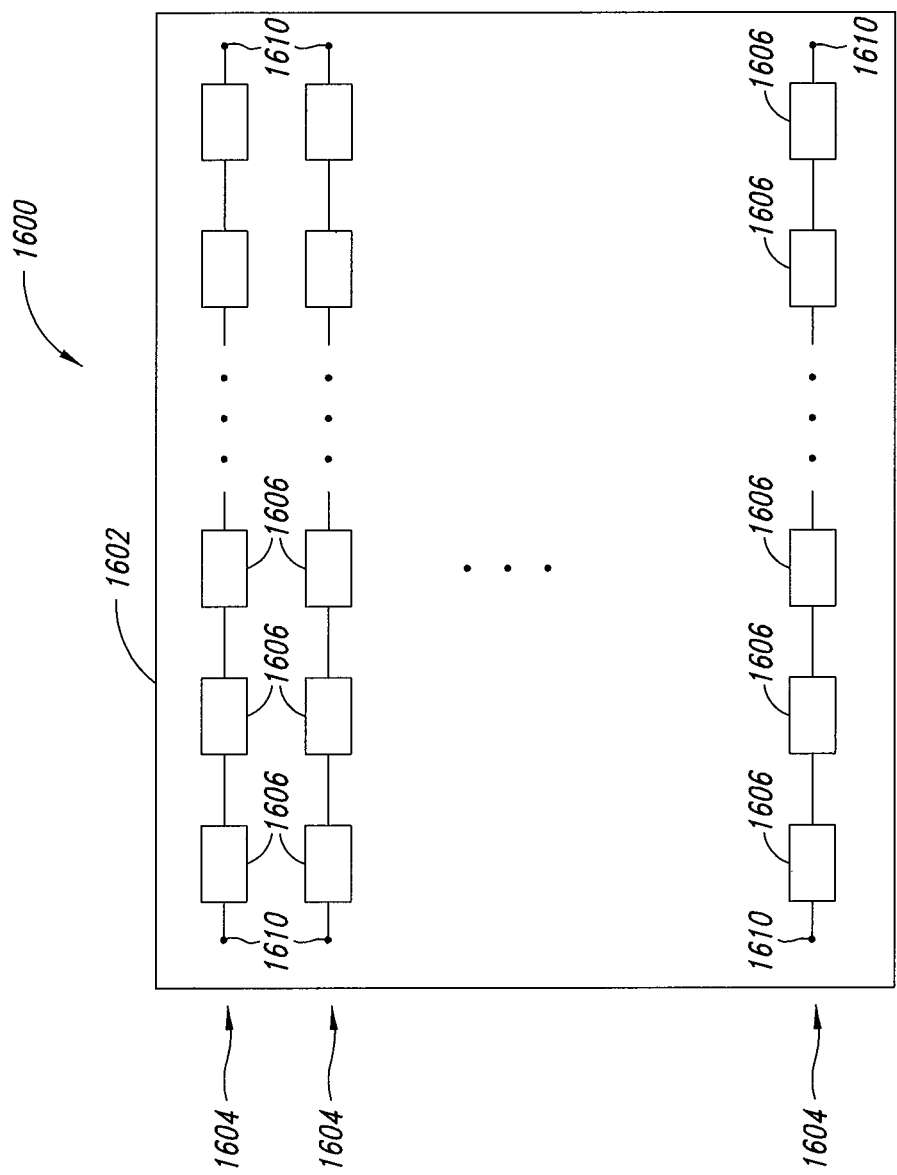
FIG. 16 illustrates an embodiment of an integrated circuit comprising a TEC device.
Figure 17:
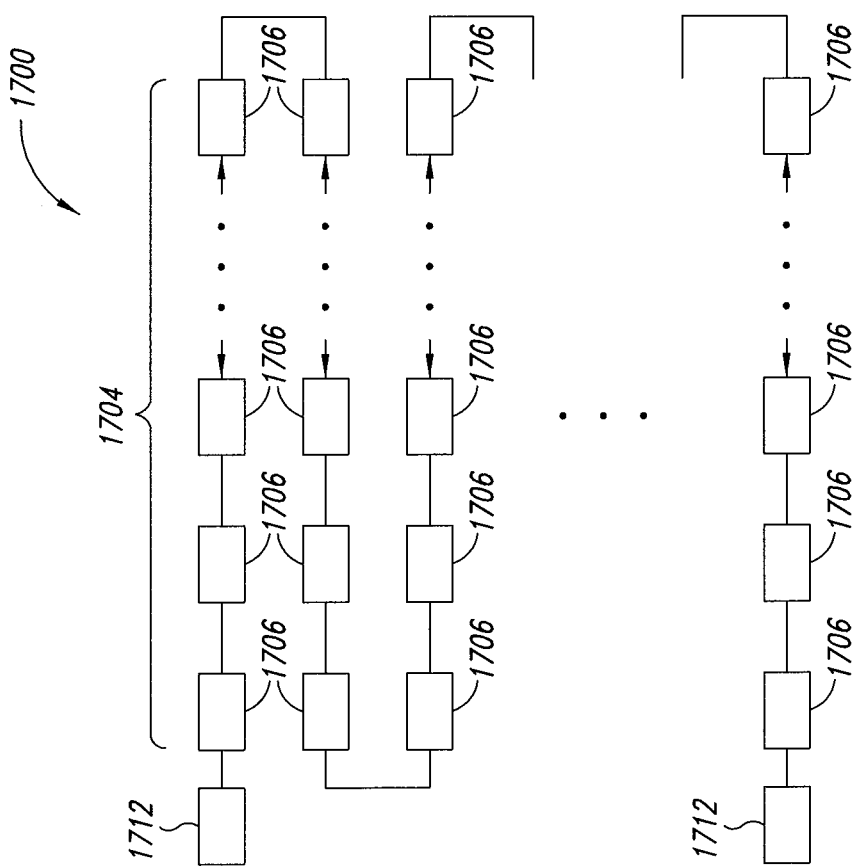
FIG. 17 illustrates an embodiment of a TEC system.
Figure 18:
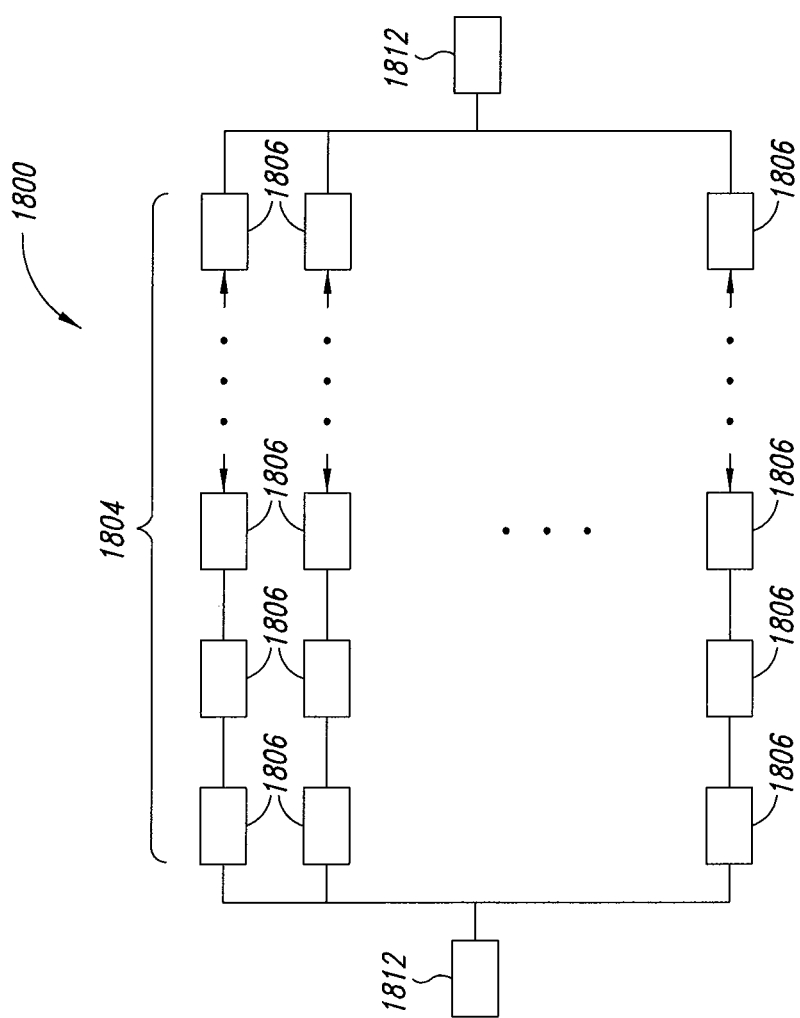
FIG. 18 illustrates an embodiment of a TEC system.
Figure 19:
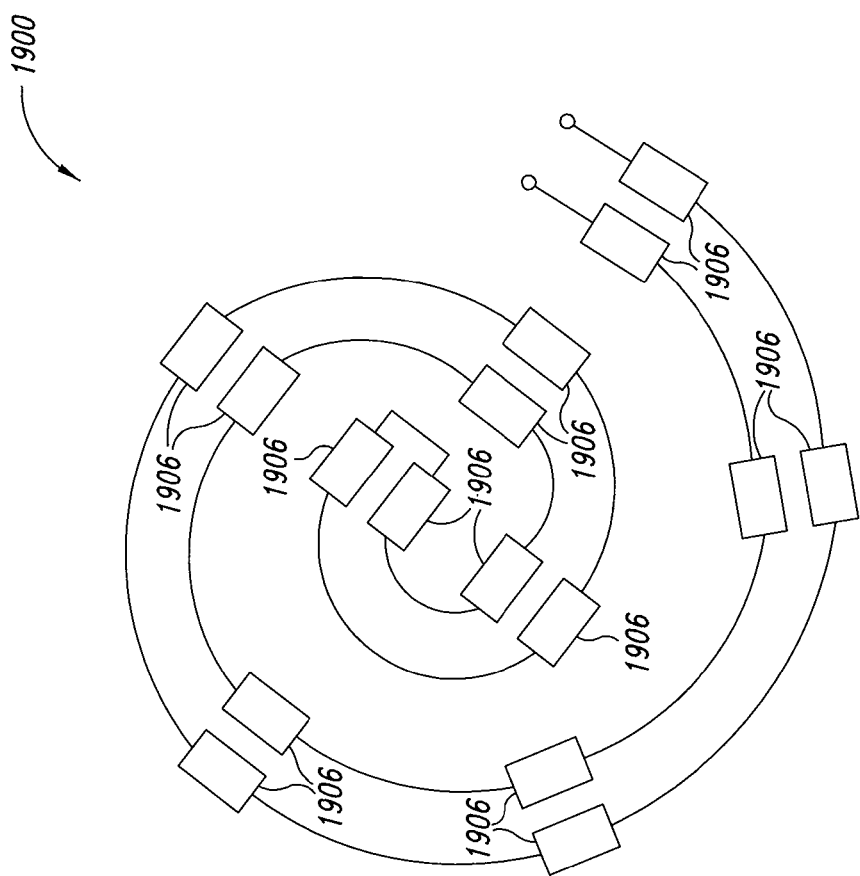
FIG. 19 illustrates an embodiment of a TEC system.

The unit cells also may be arranged in many different configurations on a die. For example, a plurality of sets of unit cells may be coupled together in parallel or in series, with each set comprising a plurality of unit cells coupled together in series. In addition, the arrangement of unit cells on a die may take into account thermodynamic characteristics of a configuration, in addition to electrical characteristics and space consumption characteristics. FIG. 16 illustrates an integrated circuit 1600 comprising a TEC 1602 having a plurality of sets 1604 of unit cells 1606. As illustrated, the TEC 1602 has a plurality of nodes 1610, that may be coupled together to, for example, coupled the plurality of sets 1604 of unit cells 1606 together in various combinations, as discussed herein. The nodes 1610 may also be used as testing pads to determine whether a unit cell or a set of unit cells is functioning properly. FIG. 17 illustrates a TEC 1700 having a plurality of sets 1704 of unit cells 1706 coupled together in series between two supply terminals 1712. FIG. 18 illustrates a TEC 1800 having a plurality of sets 1804 of unit cells 1806 coupled together in parallel between two supply terminals 1812. Sets of unit cells may be coupled together in series and then coupled to in parallel to other sets of unit cells coupled together in series. The unit cells and/or sets of unit cells need not be arranged rectilinear arrays. FIG. 19 illustrates a TEC 1900 having a set of unit cells 1906 arranged in a spiral pattern.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
a first thermally conductive region;
a first electrode having a first surface on the first thermally conductive region and a second surface opposite of the first surface;
a first semiconductor region of a first type having a first surface at least partially on the second surface of the first electrode;
a second semiconductor region of a second type different from the first type and having a first surface at least partially on the second surface of the first electrode;
a second electrode having a first surface on a second surface of the first semiconductor region, the second surface of the first semiconductor region being opposite of the first surface of the first semiconductor region and having a length different than a length of the first surface of the first semiconductor region;
a third electrode having a first surface on a second surface of the second semiconductor region, the second surface of the second semiconductor region being opposite of the first surface of the second semiconductor region and having a length different than a length of the first surface of the second semiconductor region; and
a second thermally conductive region thermally coupled to the second and third electrodes.

2. The integrated circuit of claim 1 wherein the first semiconductor region comprises:
a first portion having the first surface of the first semiconductor region at least partially on the second surface of the first electrode; and
a second portion at least partially on the first portion of the first semiconductor region and having the second surface of the first semiconductor region.

3. The integrated circuit of claim 2 wherein the first portion has a thickness greater than a thickness of the second portion.

4. The integrated circuit of claim 2 wherein a cross-section of the first semiconductor region is generally T-shaped.

5. The integrated circuit of claim 2 wherein the second semiconductor region comprises:
a first portion having the first surface of the second semiconductor region at least partially on the second surface of the first electrode; and
a second portion at least partially on the first portion of the second semiconductor region and having the second surface of the second semiconductor region.

6. The integrated circuit of claim 1 wherein the length of the first surface of the first semiconductor region is a diameter.

7. The integrated circuit of claim 1 wherein a cross-section of the second semiconductor region is generally T-shaped.

8. The integrated circuit of claim 1 wherein an area of the first surface of the first semiconductor region is less than an area of the second surface of the first semiconductor region and an area of the first surface of the second semiconductor region is less than an area of the second surface of the second semiconductor region.

9. The integrated circuit of claim 1 wherein the second thermally conductive region comprises:
a connecting portion;
a first thermal channel extending from the connecting portion to a second surface of the second electrode, the second surface of the second electrode being opposite of the first surface of the second electrode; and
a second thermal channel extending from the connecting portion to a second surface of the third electrode, the second surface of the third electrode being opposite of the first surface of the third electrode.

10. The integrated circuit of claim 9, further comprising:
a dielectric region positioned between the first thermal channel and the second thermal channel and having a thermal conductivity less than a thermal conductivity of the first and second thermal channels.

11. The integrated circuit of claim 1, further comprising a dielectric region positioned between the first and second semiconductor regions.

12. The integrated circuit of claim 11 wherein the dielectric region comprises at least one of a polymer and an oxide.

13. The integrated circuit of claim 1 wherein the first semiconductor region is a P-type semiconductor region and the second semiconductor region is an N-type semiconductor region.

14. The integrated circuit of claim 1 wherein the first and second thermally conductive regions comprise at least one of silicon nitride and silicon carbide.

15. The integrated circuit of claim 1, further comprising:
an active device on the second thermally conductive region.

16. The integrated circuit of claim 15, further comprising:
a heat sink coupled to the first thermally conductive region.

17. A system, comprising:
a first thermally conductive layer;
a first plurality of unit cells on the first thermally conductive layer, the unit cells having:
a unit cell electrode on the first thermally conductive layer;
a P-type semiconductor region having a first surface at least partially on the unit cell electrode and a coupling surface having a dimension different than a corresponding dimension of the first surface of the P-type semiconductor region; and
an N-type semiconductor region having a a first surface at least partially on the unit cell electrode and a coupling surface having a dimension different than a corresponding dimension of the first surface of the N-type semiconductor region;
a first plurality of coupling electrodes configured to electrically couple coupling surfaces of N-type semiconductor regions of unit cells to coupling surfaces of P-type semiconductor regions of adjacent unit cells; and
a second thermally conductive layer thermally coupled to the first plurality of coupling electrodes.

18. The system of claim 17 wherein a first portion of the P-type semiconductor region of a unit cell of the plurality of unit cells has a cross-sectional area different than a cross-sectional area of a second portion of the P-type semiconductor region and a first portion of the N-type semiconductor region of the unit cell has a cross-sectional area different than a cross-sectional area of a second portion of the N-type semiconductor region.

19. The system of claim 17 wherein a first portion of the P-type semiconductor region of a unit cell of the plurality of unit cells has a length and a thickness and a second portion of the P-type semiconductor region has a length greater than the length of the first portion of the P-type semiconductor region and a thickness less than the thickness of the first portion of the P-type semiconductor region.

20. The system of claim 19 wherein a first portion of the N-type semiconductor region of the unit cell has a length and a thickness and a second portion of the N-type semiconductor region has a length greater than the length of the first portion of the N-type semiconductor region and a thickness less than the thickness of the first portion of the N-type semiconductor region.

21. The system of claim 17 wherein the first surface is a surface of a first portion of the P-type semiconductor region and the coupling surface is a surface of a second portion of the P-type semiconductor region, the second portion being on the first portion, wherein a cross-section of the P-type semiconductor region of a unit cell of the plurality of unit cells is generally T-shaped.

22. The system of claim 21 wherein a cross-section of the N-type semiconductor region of the unit cell is generally T-shaped.

23. The system of claim 17 wherein the second thermally conductive layer is thermally coupled to the first plurality of coupling electrodes through a first plurality of thermally conductive channels extending from the second thermally conductive layer, and the system further comprises:
one or more regions of dielectric material positioned between the first plurality of thermally conductive channels extending from the second thermally conductive layer, the one or more of regions of dielectric material having a lower thermal conductivity than a thermal conductivity of the first plurality of thermally conductive channels extending from the second thermally conductive layer.

24. The system of claim 23 wherein a coupling electrode of the first plurality of coupling electrodes is coupled to a thermally conductive channel of the first plurality of thermally conductive channels on a first portion of a face of the coupling electrode and a part of a region of the one or more regions of dielectric material is on a second portion of the face of the coupling electrode adjacent to the first portion of the face of the coupling electrode.

25. The system of claim 17, further comprising:
a second plurality of unit cells on the first thermally conductive layer, the unit cells in the second plurality of unit cells having a unit cell electrode on the first thermally conductive layer, a P-type semiconductor region on the unit cell electrode and an N-type semiconductor region on the unit cell electrode; and
a second plurality of coupling electrodes configured to electrically couple the second plurality of unit cells together in series.

26. The system of claim 25 wherein the first plurality of unit cells is coupled in series with the second plurality of unit cells.

27. The system of claim 25 wherein the first plurality of unit cells is coupled in parallel to the second plurality of unit cells.

28. The system of claim 17 wherein the first and second thermally conductive layers comprise at least one of silicon nitride and silicon carbide.

29. The system of claim 17, further comprising:
one or more dielectric regions positioned between the unit cell electrodes of the first plurality of unit cells; and
one or more dielectric regions positioned between the P-type and the N-type semiconductor regions of the first plurality of unit cells.

30. The system of claim 17, further comprising:
an active device on the second thermally conductive layer.

31. A method, comprising:
forming a first thermally conductive region;
forming a first plurality of unit cells on the first thermally conductive region, the forming the first plurality of unit cells including:
forming a first plurality of unit cell electrodes on the first thermally conductive region;
forming respective first P-type semiconductor regions on the first plurality of unit cell electrodes;
forming respective first N-type semiconductor regions on the first plurality of unit cell electrodes;
forming respective second P-type semiconductor regions on the first P-type semiconductor regions; and
forming respective second N-type semiconductor regions on the first N-type semiconductor regions;
forming a first plurality of coupling electrodes electrically coupling the first plurality of unit cells together in series; and
forming a second thermally conductive region thermally coupled to the first plurality of coupling electrodes, wherein
the first P-type semiconductor region of a unit cell of the first plurality of unit cells has an area of a first size in contact with a unit cell electrode of the first plurality of unit cell electrodes; and
the second P-type semiconductor region of the unit cell has an area of a second size different from the first size in contact with a coupling electrode of the first plurality of coupling electrodes.

32. The method of claim 31 wherein the first P-type semiconductor region of the unit cell of the plurality of unit cells has a length different than a length of the second P-type semiconductor region of the unit cell and the first N-type semiconductor region of the unit cell has a length different than a length of the second N-type semiconductor region of the unit cell.

33. The method of claim 31 wherein the first P-type semiconductor region of the unit cell of the plurality of unit cells has a length and a thickness and the second P-type semiconductor region of the unit cell has a length greater than the length of the first P-type semiconductor region and a thickness less than the thickness of the first P-type semiconductor region, and the first N-type semiconductor region of the unit cell has a length and a thickness and the second N-type semiconductor region of the unit cell has a length greater than the length of the first N-type semiconductor region and a thickness less than the thickness of the first N-type semiconductor region.

34. The method of claim 31 wherein forming the second thermally conductive region thermally coupled to the first plurality of coupling electrodes comprises:
forming a dielectric region on the first plurality of coupling electrodes;
forming thermally conductive channels extending through the dielectric region to the coupling electrodes, the dielectric region having a lower thermal conductivity than the thermally conductive channels; and
forming the second thermally conductive region on the dielectric region and the thermally conductive channels extending through the dielectric region.

35. The method of claim 34 wherein forming the first and second thermally conductive regions comprises forming at least one of a silicon nitride region and a silicon carbide region and forming the dielectric region comprises forming at least one of a polymer region and an oxide region.

36. The method of claim 31, further comprising:
forming an active device on the second thermally conductive region.

37. The method of claim 31, comprising:
forming a second plurality of unit cells on the first thermally conductive region; and
forming a second plurality of coupling electrodes configured to electrically couple the second plurality of unit cells together in series.

38. A semiconductor package, comprising:
an active device; and
a thermoelectric cooling device coupled to the active device and including:
first means for spreading heat;
second means for spreading heat coupled to the active device; and
a thermoelectric heat-transfer device configured to transfer heat from the second means for spreading heat to the first means for spreading heat, the thermoelectric heat-transfer device having:
a plurality of P-type regions having a first coupling surface with a first area of a first magnitude and a second coupling surface having an area of a second magnitude different from the first magnitude; and
a plurality of N-type regions having a first coupling surface with a first area of a third magnitude and a second coupling surface having an area of a fourth magnitude different from the third magnitude.

39. The semiconductor package of claim 38 wherein the first and second means for spreading heat comprise at least one of a layer of silicon nitride and a layer of silicon carbide.

40. The semiconductor package of claim 38 wherein a cross-section of a P-type semiconductor region of the plurality of P-type semiconductor regions is generally T-shaped and a cross-section of an N-type semiconductor region of the plurality of N-type semiconductor regions is generally T-shaped.

41. The semiconductor package of claim 38 wherein a first portion of a P-type region of the plurality of P-type regions has a different doping level than a doping level of a second portion of the P-type region.

42. The semiconductor package of claim 38 wherein a second portion of a P-type region of the plurality of P-type regions is on a first portion of the P-type region.

* * * * *